United States Patent
Liu

(10) Patent No.: US 8,046,659 B1
(45) Date of Patent: Oct. 25, 2011

(54) ERASURE FORECASTING AND ERROR-CORRECTION STRATEGIES

(75) Inventor: Peter Tze-Hwa Liu, Alameda, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/758,881

(22) Filed: Apr. 13, 2010

Related U.S. Application Data

(62) Division of application No. 11/400,476, filed on Apr. 7, 2006, now Pat. No. 7,698,619.

(60) Provisional application No. 60/711,099, filed on Aug. 25, 2005.

(51) Int. Cl.
*H03M 13/00* (2006.01)
(52) U.S. Cl. ......... 714/752; 714/762; 714/788; 714/784
(58) Field of Classification Search .......... 714/751–752, 714/784, 786, 788, 759, 762
See application file for complete search history.

(56) References Cited

U.S. PATENT DOCUMENTS

| 4,835,772 | A | 5/1989 | Peile et al. |
| 4,916,702 | A | 4/1990 | Berlekamp |
| 5,280,488 | A | 1/1994 | Glover et al. |
| 6,321,357 | B1 | 11/2001 | Ouyang |
| 6,490,262 | B1 | 12/2002 | Hogger |
| 6,697,985 | B1 | 2/2004 | Ilani |
| 7,698,619 | B1* | 4/2010 | Liu .............................. 714/752 |
| 2001/0044920 | A1* | 11/2001 | Koppelaar .................... 714/784 |
| 2005/0286566 | A1 | 12/2005 | Tong et al. |

* cited by examiner

*Primary Examiner* — Guy Lamarre

(57) ABSTRACT

A system including a forecasting module, a decoder module, and an error detecting module. The forecasting module is configured to forecast a number of erasures in an input signal, where the erasures include information about errors in the input signal due to a burst error. The decoder module is configured to decode codewords received in the input signal based on the erasures in response to the number of the erasures being less than or equal to a predetermined threshold. The decoder module is configured to not decode the codewords based on the erasures in response to the number of the erasures being greater than the predetermined threshold. The error detecting module is configured to (i) detect the burst error and (ii) decode the codewords in response to the decoder module not decoding the codewords due to the number of the erasures being greater than the predetermined threshold.

22 Claims, 15 Drawing Sheets

ERASURE FORECASTING AND ERROR-CORRECTION STRATEGIES

CROSS-REFERENCE TO RELATED APPLICATIONS

This application is a divisional of U.S. patent application Ser. No. 11/400,476, filed Apr. 7, 2006 (now U.S. Pat. No. 7,698,619, issued Apr. 13, 2010), which claims the benefit of U.S. Provisional Application No. 60/711,099, filed Aug. 25, 2005. The disclosures of the above applications are incorporated herein by reference in their entirety.

FIELD OF THE INVENTION

The present invention relates to electronic data communication systems, and more particularly to erasure forecasting and error-correction strategies.

BACKGROUND OF THE INVENTION

Mass-storage devices such as disk drives, compact disks, DVD's, etc., tend to develop media defects over time, which cause data errors. Communication systems such as wireless networks, satellite broadcast systems, xDSL modems, etc., experience data errors caused by noise, interference, etc. Numerous error-correcting techniques such as Reed-Solomon (RS) coding are used to correct such errors.

Referring now to FIG. 1A, a RS code-based error-correcting system 10 includes a RS encoder 12 that receives a block of digital data from a data source such as a communication system (not shown). The RS encoder 12 adds redundant check-bytes to the block of digital data. The combined data is transmitted via a communication channel 14 such as a transmission line or a wireless link. The data may also be stored in a mass-storage device 15 such as a disk drive. Errors may occur during transmission or storage of the data due to noise, interference, media defects, etc. A RS decoder 16 decodes each block of data and attempts to correct errors and recover the original data. The number and type of errors that can be corrected depend on the characteristics of the RS code.

In an error-correcting scheme that uses RS codes, a polynomial is constructed using data symbols (e.g., data bytes) that are to be transmitted. An over-sampled plot of the polynomial is transmitted instead of transmitting the data symbols. Because the transmitted data is over-sampled with redundant information, the polynomial and the data symbols can be substantially reconstructed when received despite transmission errors.

Typically, the scheme encodes the data in a data block as points of a polynomial plotted over a finite field. The coefficients of the polynomial are the data symbols of the data block. The plot over-determines the coefficients, which can be recovered from subsets of the plotted points. Just as a curve can be corrected by interpolating past a gap, a RS code can bridge a series of errors in the data block to recover the coefficients of the polynomial.

Specifically, if the system 10 uses a RS(N,K) code, the RS encoder 12 receives a block of data comprising K message bytes. The RS encoder 12 adds R redundant bytes to the data to generate an N-byte codeword, where R=N−K. The error-correcting ability of the RS(N,K) code is a function of the redundancy R. For example, the RS decoder 16 using the RS(N,K) code can correct up to R/2 bytes that may contain errors. That is, the RS code can correct half as many erroneous bytes as the number of redundant bytes that are added to the data block.

Errors in systems such as mass-storage devices, communication systems, etc., generally occur in the form of Additive White Gaussian Noise (AWGN) and in bursts. The RS code is frequently used to correct errors in these systems. When errors occur in bursts and the number of errors in a codeword exceeds R/2, the RS decoder 16 may fail to correct the errors. Some systems use an interleaver and a de-interleaver between the RS encoder 12 and the RS decoder 16 to improve error-correction capability of the RS decoder 16.

Referring now to FIG. 1B, an interleaver 13 with an interleave depth D spreads a block of N consecutive bytes of a RS codeword evenly into D*N bytes before transmission. A de-interleaver 17 de-spreads the D*N bytes back into the N consecutive bytes of the block. If the communications channel 14 encounters a burst error of B bytes, the de-interleaver 17 de-spreads the B bytes of the burst error evenly into shorter bursts each of length B/D. Thus, each RS codeword encounters only B/D bytes of errors. That is, the interleaver 13 of depth D effectively cuts the longer burst into shorter bursts by a factor of D. If B/D is less than R/2, the RS decoder 16 can correct all the burst errors. If B/D is larger than R/2, however, the RS decoder 16 can not correct the burst errors.

One way to solve this problem is to increase the interleaver depth D. For example, D can be increased up to 4096 in some modern systems such as VDSL2. The cost of hardware, however, to implement such an interleaver may be very high. Additionally, the hardware that implements such an interleaver may significantly increase latency delay, which may degrade system performance.

Referring now to FIGS. 2-3, some exemplary implementations of the decoding and error-correcting scheme that uses the interleaver and de-interleaver are shown. Referring now to FIG. 2, a mass-storage device 20 such as a disk drive communicates with a host adapter 22. The host adapter 22 transmits data that is to be stored in the storage device 20. An encoder 24 in the storage device 20 uses a coding scheme such as RS coding to encode the data. An interleaver 25 interleaves RS codewords. A read/write preamplifier 26 amplifies the encoded and interleaved data. A read/write element (not shown) writes the amplified data on a recording medium 28 of the storage device 20.

To retrieve the data stored in the storage device 20, the host adapter 22 sends a read request to the storage device 20. The read/write element reads the data from the recording medium 28. The read/write preamplifier 26 amplifies the data. A de-interleaver 29 de-spreads the data back into consecutive RS codewords. A decoding and error correcting module 30 decodes the data and corrects any errors in the data. The storage device 20 transmits the data to the host adapter 22.

In recent years, data-density, spin rates, and throughput rates of mass-storage devices have been steadily increasing. Accordingly, designing the devices with fast and accurate interleaving, decoding, and error-correcting schemes is becoming increasingly important to ensure data reliability.

Referring now to FIG. 3, a high-speed, high-bandwidth communication system 50 utilizes a Very high bit-rate Digital Subscriber Line (VDSL) or VDSL2 to transport data. The system 50 comprises a VDSL/VDSL2 host computer 52, a VDSL/VDSL2 transceiver 54, and multiple subscribers 56-1, . . . , 56-N (collectively 56).

The VDSL/VDSL2 transceiver 54 utilizes a discrete multi-tone (DMT) carrier system to transport data between the VDSL/VDSL2 host computer 52 and the subscribers 56. A DMT module 58 controls the DMT carrier system. An encoder 60 encodes data from the VDSL/VDSL2 host computer 52. An interleaver 59 interleaves RS codewords into dispersed version before the data is transmitted to the subscribers 56. A de-interleaver 61 de-spreads the data received from the subscribers 56 back into consecutive RS codewords. A decoding and error-correcting module 62 decodes data received from de-interleaver 61 and corrects any errors in the received data. The decoded data is forwarded to the VDSL/VDSL2 host computer 52.

The DMT module 58 divides a very wide spectrum of signal received from a subscriber 56 into many separate 4 KHz sub-channels. For example, an ADSL system can divide a spectrum of 1 MHz spectrum into 256 sub-channels each of 4-KHz. Some of the 256 channels may transport data in one direction while others may transport data in the reverse direction (i.e., upstream and downstream) between the VDSL/VDSL2 transceiver 54 and the subscribers 56. Additionally, the DMT module 58 monitors each channel and searches for the best channels to transmit and receive data. If quality of one channel is impaired due to high error rates, the DMT module 58 shifts a signal to another channel.

For VDSL/VDSL2 to function effectively and deliver designed performance, the DMT carrier system requires that the data received from multiple channels be decoded and reconstructed speedily and accurately. To achieve this goal using traditional interleaving, decoding, and error-correcting techniques, extensive hardware may be required. Using extensive hardware can increase system cost and system latency delay. VDSL2, which transports data at speeds of up to 100 Mbps upstream and 100 Mbps downstream, demands even higher decoding and error-correcting capabilities than VDSL.

SUMMARY OF THE INVENTION

An erasure forecasting system comprises a control module that selects erasure parameters and that determines error-detection thresholds for forecasting erasure in an input signal. The erasure forecasting system comprises an erasure feed-forward module that receives the input signal, that forecasts erasure in the input signal, that generates an erasure feed-forward signal based on the erasure parameters and the error-detection thresholds, and that generates codewords based on the erasure feed-forward signal and the input signal. The erasure forecasting system comprises an erasure decoder that determines that the input signal is one of erroneous and not erroneous based on the erasure feed-forward signal.

In another feature, a system comprises the erasure forecasting system, wherein the system includes at least one of error-logs, design specifications, and performance specifications of the system, and wherein the control module selects the erasure parameters and the error-detection thresholds based on at least one of the error-logs, the design specifications, and the performance specifications of the system.

In another feature, the erasure feed-forward module further comprises a de-mapper module that de-maps the input signal, that generates a plurality of de-mapped signals, that compares the de-mapped signals to the error-detection thresholds, and that generates an error signal that indicates that the input signal is one of erroneous and not erroneous. A configuration module generates the erasure feed-forward signal based on at least one of the error signal, one of the erasure parameters, and one of the error-detection thresholds. A formatter module generates the codewords based on the de-mapped signals and the erasure feed-forward signal. A de-interleaver module de-interleaves the codewords in a plurality of segments based on a length of the codewords, a predetermined interleave factor, and a predetermined interleave depth. The erasure decoder uses one of a cyclic code and a Reed-Solomon code to determine erasure in the input signal.

In another feature, the erasure forecasting system further comprises an erasure feedback module that forecasts erasure in the input signal and that generates an erasure feedback signal based on erasure information derived from the erasure decoder. A de-interleaver module that de-interleaves the codewords in a plurality of segments based on a length of the codewords, a predetermined interleave factor, and a predetermined interleave depth. The erasure feedback module calculates raw error counts for the segments and calculates a filtered error-count for each one of the segments. The filtered error-count is an average of the raw error-counts for F of the segments, where F is a positive integer equal to a filter-level predetermined by the control module, wherein the F of the segments are adjacent to each other. The erasure feedback module determines that one of the segments is erasure and generates the erasure feedback signal for the one of the segments if the filtered error-count for the one of the segments exceeds an erasure feedback threshold predetermined by the control module. The erasure decoder determines that data in the codewords is erroneous if the data is located in one of the segments that is determined as erasure by the erasure feedback module. The erasure forecasting system filters errors caused by additive white Gaussian noise from the input. The erasure decoder determines that the input signal is one of erroneous and not erroneous based on at least one of the erasure feed-forward signal and the erasure feedback signal.

In another feature, the erasure forecasting system further comprises a burst error trapping (BET) module that detects burst errors in the input signal and that comprises an encoder that uses one of a Reed-Solomon code and a cyclic code. The control module activates the BET module if the erasure decoder fails to determine that the input signal is one of erroneous and not erroneous. The control module activates the BET module if the erasure feed-forward module fails to forecast erasure in the input signal. The BET module comprises a linear feedback shift register (LFSR) having R registers, where R is a positive integer that is a measure of redundancy in the codewords. The BET module loads one of the codewords into the LFSR, shifts the LFSR N times, where N is a positive integer equal to a length of the codewords, and determines that the one of the codewords is not erroneous if the R registers have remainders equal to zero. The BET module loads one of the codewords into the LFSR, shifts the LFSR N times, where N is a positive integer equal to a length of the codewords, appends the LFSR with N zeros, and performs additional N shifts. The BET module determines that the input signal is erroneous if a number of leading zeros in one of the R registers having a maximum number of leading zeros after the additional N shifts exceeds a BET threshold predetermined by the control module. The BET module forecasts a location of one of the burst errors based on R, N, and a number of one of the additional N shifts that generates the maximum number of leading zeros. The erasure forecasting system further comprises an overwrite module that writes an output of the BET module over an output of the erasure decoder if the erasure decoder fails to determine that the input signal is one of erroneous and not erroneous. The overwrite module writes an output of the BET module over an output of the erasure decoder if the BET module detects one of the burst errors in one of the codewords.

In another feature, a communication system based on one of a very high bit rate digital subscriber line (VDSL) and VDSL2, comprises the erasure forecasting system.

In still other features, a method for erasure forecasting comprises selecting erasure parameters, determining error-detection thresholds for forecasting erasure in an input signal, receiving the input signal, forecasting erasure in the input signal, generating an erasure feed-forward signal based on the erasure parameters and the error-detection thresholds, generating codewords based on the erasure feed-forward signal and the input signal, and determining that the input signal is one of erroneous and not erroneous based on the erasure feed-forward signal.

In another feature, the method further comprises selecting the erasure parameters and the error-detection thresholds based on at least one of error-logs, design specifications, and performance specifications of a system.

In another feature, the method further comprises de-mapping the input signal, generating a plurality of de-mapped signals, comparing the de-mapped signals to the error-detection thresholds, and generating an error signal that indicates that the input signal is one of erroneous and not erroneous. The method further comprises generating the erasure feed-forward signal based on at least one of the error signal, one of the erasure parameters, and one of the error-detection thresholds. The method further comprises generating the codewords based on the de-mapped signals and the erasure feed-forward signal. The method further comprises de-interleaving the codewords in a plurality of segments based on a length of the codewords, a predetermined interleave factor, and a predetermined interleave depth. The method further comprises determining erasure in the input signal using one of a cyclic code and a Reed-Solomon code.

In another feature, the method further comprises forecasting erasure in the input signal and generating an erasure feedback signal based on erasure information determined by decoding the input signal using one of a cyclic code and a Reed-Solomon code. The method further comprises de-interleaving the codewords in a plurality of segments based on a length of the codewords, a predetermined interleave factor, and a predetermined interleave depth. The method further comprises calculating raw error counts for the segments and calculating a filtered error-count for each one of the segments. The filtered error-count is an average of the raw error-counts for F of the segments, where F is a positive integer equal to a predetermined filter-level, wherein the F of the segments are adjacent to each other. The method further comprises determining that one of the segments is erasure and generating the erasure feedback signal for the one of the segments if the filtered error-count for the one of the segments exceeds a predetermined erasure feedback threshold. The method further comprises determining that data in the codewords is erroneous if the data is located in one of the segments that is determined as erasure. The method further comprises filtering errors caused by additive white Gaussian noise from the input. The method further comprises determining that the input signal is one of erroneous and not erroneous based on at least one of the erasure feed-forward signal and the erasure feedback signal.

In another feature, the method further comprises burst error trapping (BET) wherein burst errors are detected in the input signal using one of a Reed-Solomon code and a cyclic code. The burst errors are detected if determining whether the input signal is one of erroneous and not erroneous fails. The burst errors are detected if forecasting erasure in the input signal based on the feed-forward signal fails. The method further comprises providing a linear feedback shift register (LFSR) having R registers, where R is a positive integer that is a measure of redundancy in the codewords. The method further comprises loading one of the codewords into the LFSR, shifting the LFSR N times, where N is a positive integer equal to a length of the codewords, and determining that the one of the codewords is not erroneous if the R registers have remainders equal to zero. The method further comprises loading one of the codewords into the LFSR, shifting the LFSR N times, where N is a positive integer equal to a length of the codewords, appending the LFSR with N zeros, and performing additional N shifts. The method further comprises determining that the input signal is erroneous if a number of leading zeros in one of the R registers having a maximum number of leading zeros after the additional N shifts exceeds a predetermined BET threshold. The method further comprises forecasting a location of one of the burst errors based on R, N, and a number of one of the additional N shifts that generates the maximum number of leading zeros. The method further comprises outputting results of the BET if determining whether the input signal is one of erroneous and not erroneous fails. The method further comprises outputting results of the BET if one of the burst errors is detected in one of the codewords.

In another feature, a communication system based on one of a very high bit rate digital subscriber line (VDSL) and VDSL2, comprises the method.

In still other features, an erasure forecasting system comprises control means for selecting erasure parameters and determining error-detection thresholds for forecasting erasure in an input signal. The erasure forecasting system comprises erasure feed-forward means for receiving the input signal, forecasting erasure in the input signal, generating an erasure feed-forward signal based on the erasure parameters and the error-detection thresholds, and generating codewords based on the erasure feed-forward signal and the input signal. The erasure forecasting system comprises erasure decoder means for determining that the input signal is one of erroneous and not erroneous based on the erasure feed-forward signal.

In another feature, a system comprises the erasure forecasting system, wherein the system includes at least one of error-logs, design specifications, and performance specifications of the system, and wherein the control means selects the erasure parameters and the error-detection thresholds based on at least one of the error-logs, the design specifications, and the performance specifications of the system.

In another feature, the erasure feed-forward means further comprises de-mapper means for de-mapping the input signal, generating a plurality of de-mapped signals, comparing the de-mapped signals to the error-detection thresholds, and generating an error signal that indicates that the input signal is one of erroneous and not erroneous. The erasure forecasting system further comprises configuration means for generating the erasure feed-forward signal based on at least one of the error signal, one of the erasure parameters, and one of the error-detection thresholds. The erasure forecasting system further comprises formatter means for generating the codewords based on the de-mapped signals and the erasure feed-forward signal. The erasure forecasting system further comprises de-interleaver means for de-interleaving the codewords in a plurality of segments based on a length of the codewords, a predetermined interleave factor, and a predetermined interleave depth. The erasure decoder means uses one of a cyclic code and a Reed-Solomon code to determine erasure in the input signal.

In another feature, the erasure forecasting system further comprises erasure feedback means for forecasting erasure in the input signal and generating an erasure feedback signal based on erasure information derived from the erasure decoder means. The erasure forecasting system further comprises de-interleaver means for de-interleaving the codewords in a plurality of segments based on a length of the codewords, a predetermined interleave factor, and a predetermined interleave depth. The erasure feedback means calculates raw error counts for the segments and calculates a filtered error-count for each one of the segments. The filtered error-count is an average of the raw error-counts for F of the segments, where F is a positive integer equal to a filter-level predetermined by the control means, wherein the F of the segments are adjacent to each other. The erasure feedback means determines that one of the segments is erasure and generates the erasure feedback signal for the one of the segments if the filtered error-count for the one of the segments exceeds an erasure feedback threshold predetermined by the control means. The erasure decoder means determines that data in the codewords is erroneous if the data is located in one of the segments that is determined as erasure by the erasure feedback means. The erasure forecasting system filters errors caused by additive white Gaussian noise from the input. The erasure decoder means determines that the input signal is one of erroneous and not erroneous based on at least one of the erasure feed-forward signal and the erasure feedback signal.

In another feature, the erasure forecasting system further comprises burst error trapping (BET) means for detecting burst errors in the input signal, wherein the BET means comprises encoder means for using one of a Reed-Solomon code and a cyclic code. The control means activates the BET means if the erasure decoder means fails to determine that the input signal is one of erroneous and not erroneous. The control means activates the BET means if the erasure feed-forward means fails to forecast erasure in the input signal. The BET means comprises a linear feedback shift register (LFSR) having R registers, where R is a positive integer that is a measure of redundancy in the codewords. The BET means loads one of the codewords into the LFSR, shifts the LFSR N times, where N is a positive integer equal to a length of the codewords, and determines that the one of the codewords is not erroneous if the R registers have remainders equal to zero. The BET means loads one of the codewords into the LFSR, shifts the LFSR N times, where N is a positive integer equal to a length of the codewords, appends the LFSR with N zeros, and performs additional N shifts. The BET means determines that the input signal is erroneous if a number of leading zeros in one of the R registers having a maximum number of leading zeros after the additional N shifts exceeds a BET threshold predetermined by the control means. The BET means forecasts a location of one of the burst errors based on R, N, and a number of one of the additional N shifts that generates the maximum number of leading zeros. The erasure forecasting system further comprises overwrite means for writing an output of the BET means over an output of the erasure decoder means if the erasure decoder means fails to determine that the input signal is one of erroneous and not erroneous. The erasure forecasting system further comprises overwrite means for writing an output of the BET means over an output of the erasure decoder means if the BET means detects one of the burst errors in one of the codewords.

In another feature, a communication system based on one of a very high bit rate digital subscriber line (VDSL) and VDSL2, comprises the erasure forecasting system.

In still other features, a computer method for erasure forecasting comprises selecting erasure parameters, determining error-detection thresholds for forecasting erasure in an input signal, receiving the input signal, forecasting erasure in the input signal, generating an erasure feed-forward signal based on the erasure parameters and the error-detection thresholds, generating codewords based on the erasure feed-forward signal and the input signal, and determining that the input signal is one of erroneous and not erroneous based on the erasure feed-forward signal.

In another feature, the computer method further comprises selecting the erasure parameters and the error-detection thresholds based on at least one of error-logs, design specifications, and performance specifications of a system.

In another feature, the computer method further comprises de-mapping the input signal, generating a plurality of de-mapped signals, comparing the de-mapped signals to the error-detection thresholds, and generating an error signal that indicates that the input signal is one of erroneous and not erroneous. The computer method further comprises generating the erasure feed-forward signal based on at least one of the error signal, one of the erasure parameters, and one of the error-detection thresholds. The computer method further comprises generating the codewords based on the de-mapped signals and the erasure feed-forward signal. The computer method further comprises de-interleaving the codewords in a plurality of segments based on a length of the codewords, a predetermined interleave factor, and a predetermined interleave depth. The computer method further comprises determining erasure in the input signal using one of a cyclic code and a Reed-Solomon code.

In another feature, the computer method further comprises forecasting erasure in the input signal and generating an erasure feedback signal based on erasure information determined by decoding the input signal using one of a cyclic code and a Reed-Solomon code. The computer method further comprises de-interleaving the codewords in a plurality of segments based on a length of the codewords, a predetermined interleave factor, and a predetermined interleave depth. The computer method further comprises calculating raw error counts for the segments and calculating a filtered error-count for each one of the segments. The filtered error-count is an average of the raw error-counts for F of the segments, where F is a positive integer equal to a predetermined filter-level, wherein the F of the segments are adjacent to each other. The computer method further comprises determining that one of the segments is erasure and generating the erasure feedback signal for the one of the segments if the filtered error-count for the one of the segments exceeds a predetermined erasure feedback threshold. The computer method further comprises determining that data in the codewords is erroneous if the data is located in one of the segments that is determined as erasure. The computer method further comprises filtering errors caused by additive white Gaussian noise from the input. The computer method further comprises determining that the input signal is one of erroneous and not erroneous based on at least one of the erasure feed-forward signal and the erasure feedback signal.

In another feature, the computer method further comprises burst error trapping (BET) wherein burst errors are detected in the input signal using one of a Reed-Solomon code and a cyclic code. The burst errors are detected if determining whether the input signal is one of erroneous and not erroneous fails. The burst errors are detected if forecasting erasure in the input signal based on the feed-forward signal fails. The computer method further comprises providing a linear feedback shift register (LFSR) having R registers, where R is a positive integer that is a measure of redundancy in the codewords. The computer method further comprises loading one of the codewords into the LFSR, shifting the LFSR N times, where N is a positive integer equal to a length of the codewords, and determining that the one of the codewords is not erroneous if the R registers have remainders equal to zero. The computer method further comprises loading one of the codewords into the LFSR, shifting the LFSR N times, where N is a positive integer equal to a length of the codewords, appending the LFSR with N zeros, and performing additional N shifts. The computer method further comprises determining that the input signal is erroneous if a number of leading zeros in one of the R registers having a maximum number of leading zeros after the additional N shifts exceeds a predetermined BET threshold. The computer method further comprises forecasting a location of one of the burst errors based on R, N, and a number of one of the additional N shifts that generates the maximum number of leading zeros. The computer method further comprises outputting results of the BET if determining whether the input signal is one of erroneous and not erroneous fails. The computer method further comprises outputting results of the BET if one of the burst errors is detected in one of the codewords.

In another feature, a communication system based on one of a very high bit rate digital subscriber line (VDSL) and VDSL2, comprises the computer method.

In still other features, an erasure forecasting system comprises a control module that selects erasure parameters and that determines error-detection thresholds for forecasting erasure in an input signal. The erasure forecasting system comprises an erasure decoder decodes erasure information from the input signal based on the erasure parameters and the error-detection thresholds. The erasure forecasting system comprises an erasure feedback module that forecasts erasure in the input signal based on the erasure information derived from the erasure decoder and that generates an erasure feedback signal that the erasure decoder uses to determine whether the input signal is one of erroneous and not erroneous.

In another feature, a system comprises the erasure forecasting system, wherein the system includes at least one of error-logs, design specifications, and performance specifications of the system, and wherein the control module selects the erasure parameters and the error-detection thresholds based on at least one of the error-logs, the design specifications, and the performance specifications of the system.

In another feature, the erasure forecasting system further comprises a de-interleaver module that de-interleaves codewords of the input signal in a plurality of segments based on a length of the codewords, a predetermined interleave factor, and a predetermined interleave depth. The erasure feedback module calculates raw error-counts for the segments and calculates a filtered error-count for each one of the segments. The filtered error-count is an average of the raw error-counts for F of the segments, where F is a positive integer equal to a filter-level predetermined by the control module, wherein the F of the segments are adjacent to each other. The erasure feedback module determines that one of the segments is erasure and generates the erasure feedback signal for the one of the segments if the filtered error-count for the one of the segments exceeds an erasure feedback threshold predetermined by the control module. The erasure decoder determines that data in the codewords is erroneous if the data is located in one of the segments that is determined as erasure by the erasure feedback module. The erasure forecasting system filters errors caused by additive white Gaussian noise from the input.

In another feature, the erasure forecasting system further comprises an erasure feed-forward module that receives the input signal, that forecasts erasure in the input signal, that generates an erasure feed-forward signal based on the erasure parameters and the error-detection thresholds, and that generates codewords based on the erasure feed-forward signal and the input signal. A de-mapper module de-maps the input signal, generates a plurality of de-mapped signals, compares the de-mapped signals to the error-detection thresholds, and generates an error signal that indicates that the input signal is one of erroneous and not erroneous. A configuration module generates the erasure feed-forward signal based on at least one of the error signal, one of the erasure parameters, and one of the error-detection thresholds. A formatter module generates the codewords based on the de-mapped signals and the erasure feed-forward signal. The erasure decoder uses one of a cyclic code and a Reed-Solomon code to determine erasure in the input signal. The erasure decoder determines that the input signal is one of erroneous and not erroneous based on at least one of the erasure feed-forward signal and the erasure feedback signal.

In another feature, the erasure forecasting system further comprises a burst error trapping (BET) module that detects burst errors in a plurality of codewords of the input signal and that comprises an encoder that uses one of a Reed-Solomon code and a cyclic code. The control module activates the BET module if the erasure decoder fails to determine that the input signal is one of erroneous and not erroneous. The control module activates the BET module if at least one of the erasure feed-forward module and the erasure feedback module fails to forecast erasure in the input signal. The BET module comprises a linear feedback shift register (LFSR) having R registers, where R is a positive integer that is a measure of redundancy in the codewords. The BET module loads one of the codewords into the LFSR, shifts the LFSR N times, where N is a positive integer equal to a length of the codewords, and determines that the one of the codewords is not erroneous if the R registers have remainders equal to zero. The BET module loads one of the codewords into the LFSR, shifts the LFSR N times, where N is a positive integer equal to a length of the codewords, appends the LFSR with N zeros, and performs additional N shifts. The BET module determines that the input signal is erroneous if a number of leading zeros in one of the R registers having a maximum number of leading zeros after the additional N shifts exceeds a BET threshold predetermined by the control module. The BET module forecasts a location of one of the burst errors based on R, N, and a number of one of the additional N shifts that generates the maximum number of leading zeros. The erasure forecasting system further comprises an overwrite module that writes an output of the BET module over an output of the erasure decoder if the erasure decoder fails to determine that the input signal is one of erroneous and not erroneous. The erasure forecasting system further comprises an overwrite module that writes an output of the BET module over an output of the erasure decoder if the BET module detects one of the burst errors in one of the codewords.

In another feature, a communication system based on one of a very high bit rate digital subscriber line (VDSL) and VDSL2, comprises the erasure forecasting system.

In still other features, a method for erasure forecasting comprises selecting erasure parameters, determining error-detection thresholds for forecasting erasure in an input signal, decoding erasure information from the input signal based on the erasure parameters and the error-detection thresholds, forecasting erasure in the input signal based on the erasure information, generating an erasure feedback signal, and determining that the input signal is one of erroneous and not erroneous based on the erasure feedback signal.

In another feature, the method further comprises selecting the erasure parameters and the error-detection thresholds based on at least one of error-logs, design specifications, and performance specifications of a system.

In another feature, the method further comprises de-interleaving codewords of the input signal in a plurality of segments based on a length of the codewords, a predetermined interleave factor, and a predetermined interleave depth. The method further comprises calculating raw error-counts for the segments and calculating a filtered error-count for each one of the segments. The filtered error-count is an average of the raw error-counts for F of the segments, where F is a positive integer equal to a predetermined filter-level, wherein the F of the segments are adjacent to each other. The method further comprises determining that one of the segments is erasure and generating the erasure feedback signal for the one of the segments if the filtered error-count for the one of the segments exceeds a predetermined erasure feedback threshold. The method further comprises determining that data in the codewords is erroneous if the data is located in one of the segments that is determined as erasure. The method further comprises filtering errors caused by additive white Gaussian noise from the input.

In another feature, the method further comprises receiving the input signal, forecasting erasure in the input signal, generating an erasure feed-forward signal based on the erasure parameters and the error-detection thresholds, and generating codewords based on the erasure feed-forward signal and the input signal. The method further comprises de-mapping the input signal, generating a plurality of de-mapped signals, comparing the de-mapped signals to the error-detection thresholds, and generating an error signal that indicates that the input signal is one of erroneous and not erroneous. The method further comprises generating the erasure feed-forward signal based on at least one of the error signal, one of the erasure parameters, and one of the error-detection thresholds. The method further comprises generating the codewords based on the de-mapped signals and the erasure feed-forward signal. The method further comprises determining erasure in the input signal using one of a cyclic code and a Reed-Solomon code. The method further comprises determining that the input signal is one of erroneous and not erroneous based on at least one of the erasure feed-forward signal and the erasure feedback signal.

In another feature, the method further comprises burst error trapping (BET) wherein burst errors are detected in a plurality of codewords of the input signal using one of a Reed-Solomon code and a cyclic code. The burst errors are detected if determining that the input signal is one of erroneous and not erroneous fails. The burst errors are detected if forecasting erasure in the input signal fails based on at least one of the erasure feed-forward signal and the erasure feedback signal. The method further comprises providing a linear feedback shift register (LFSR) having R registers, where R is a positive integer that is a measure of redundancy in the codewords. The method further comprises loading one of the codewords into the LFSR, shifting the LFSR N times, where N is a positive integer equal to a length of the codewords, and determining that the one of the codewords is not erroneous if the R registers have remainders equal to zero. The method further comprises loading one of the codewords into the LFSR, shifting the LFSR N times, where N is a positive integer equal to a length of the codewords, appending the LFSR with N zeros, and performing additional N shifts. The method further comprises determining that the input signal is erroneous if a number of leading zeros in one of the R registers having a maximum number of leading zeros after the additional N shifts exceeds a predetermined BET threshold. The method further comprises forecasting a location of one of the burst errors based on R, N, and a number of one of the additional N shifts that generates the maximum number of leading zeros. The method further comprises outputting results of the BET if determining that the input signal is one of erroneous and not erroneous fails. The method further comprises outputting results of the BET if one of the burst errors is detected in one of the codewords.

In another feature, a communication system based on one of a very high bit rate digital subscriber line (VDSL) and VDSL2, comprises the method.

In still other features, an erasure forecasting system comprises control means for selecting erasure parameters and determining error-detection thresholds for forecasting erasure in an input signal. The erasure forecasting system comprises erasure decoder means for decoding erasure information from the input signal based on the erasure parameters and the error-detection thresholds. The erasure forecasting system comprises erasure feedback means for forecasting erasure in the input signal based on the erasure information derived from the erasure decoder means and generating an erasure feedback signal that the erasure decoder means uses to determine that the input signal is one of erroneous and not erroneous.

In another feature, a system comprises the erasure forecasting system, wherein the system includes at least one of error-logs, design specifications, and performance specifications of the system, and wherein the control means selects the erasure parameters and the error-detection thresholds based on at least one of the error-logs, the design specifications, and the performance specifications of the system.

In another feature, the erasure forecasting system further comprises de-interleaver means for de-interleaving codewords of the input signal in a plurality of segments based on a length of the codewords, a predetermined interleave factor, and a predetermined interleave depth. The erasure feedback means calculates raw error-counts for the segments and calculates a filtered error-count for each one of the segments. The filtered error-count is an average of the raw error-counts for F of the segments, where F is a positive integer equal to a filter-level predetermined by the control means, wherein the F of the segments are adjacent to each other. The erasure feedback means determines that one of the segments is erasure and generates the erasure feedback signal for the one of the segments if the filtered error-count for the one of the segments exceeds an erasure feedback threshold predetermined by the control means. The erasure decoder means determines that data in the codewords is erroneous if the data is located in one of the segments that is determined as erasure by the erasure feedback means. The erasure forecasting system filters errors caused by additive white Gaussian noise from the input.

In another feature, the erasure forecasting system further comprises erasure feed-forward means for receiving the input signal, forecasting erasure in the input signal, generating an erasure feed-forward signal based on the erasure parameters and the error-detection thresholds, and generating codewords based on the erasure feed-forward signal and the input signal. The erasure feed-forward means further comprises de-mapper means for de-mapping the input signal, generating a plurality of de-mapped signals, comparing the de-mapped signals to the error-detection thresholds, and generating an error signal that indicates that the input signal is one of erroneous and not erroneous. The erasure forecasting system further comprises configuration means for generating the erasure feed-forward signal based on at least one of the error signal, one of the erasure parameters, and one of the error-detection thresholds. The erasure forecasting system further comprises formatter means for generating the codewords based on the de-mapped signals and the erasure feed-forward signal. The erasure decoder means uses one of a cyclic code and a Reed-Solomon code to determine erasure in the input signal. The erasure decoder means determines that the input signal is one of erroneous and not erroneous based on at least one of the erasure feed-forward signal and the erasure feedback signal.

In another feature, the erasure forecasting system further comprises burst error trapping (BET) means for detecting burst errors in a plurality of codewords of the input signal, wherein the BET means comprises encoder means for using one of a Reed-Solomon code and a cyclic code. The control means activates the BET means if the erasure decoder means fails to determine that the input signal is one of erroneous and not erroneous. The control means activates the BET means if at least one of the erasure feed-forward means and the erasure feedback means fails to forecast erasure in the input signal. The BET means comprises a linear feedback shift register (LFSR) having R registers, where R is a positive integer that is a measure of redundancy in the codewords. The BET means loads one of the codewords into the LFSR, shifts the LFSR N times, where N is a positive integer equal to a length of the codewords, and determines that the one of the codewords is not erroneous if the R registers have remainders equal to zero. The BET means loads one of the codewords into the LFSR, shifts the LFSR N times, where N is a positive integer equal to a length of the codewords, appends the LFSR with N zeros, and performs additional N shifts. The BET means determines that the input signal is erroneous if a number of leading zeros in one of the R registers having a maximum number of leading zeros after the additional N shifts exceeds a BET threshold predetermined by the control means. The BET means forecasts a location of one of the burst errors based on R, N, and a number of one of the additional N shifts that generates the maximum number of leading zeros. The erasure forecasting system further comprises overwrite means for writing an output of the BET means over an output of the erasure decoder means if the erasure decoder means fails to determine that the input signal is one of erroneous and not erroneous. The erasure forecasting system further comprises overwrite means for writing an output of the BET means over an output of the erasure decoder means if the BET means detects one of the burst errors in one of the codewords.

In another feature, a communication system based on one of a very high bit rate digital subscriber line (VDSL) and VDSL2, comprises the erasure forecasting system.

In still other features, a computer method for erasure forecasting comprises selecting erasure parameters, determining error-detection thresholds for forecasting erasure in an input signal, decoding erasure information from the input signal based on the erasure parameters and the error-detection thresholds, forecasting erasure in the input signal based on the erasure information, generating an erasure feedback signal and determining that the input signal is one of erroneous and not erroneous based on the erasure feedback signal.

In another feature, the computer method further comprises selecting the erasure parameters and the error-detection thresholds based on at least one of error-logs, design specifications, and performance specifications of a system.

In another feature, the computer method further comprises de-interleaving codewords of the input signal in a plurality of segments based on a length of the codewords, a predetermined interleave factor, and a predetermined interleave depth. The computer method further comprises calculating raw error-counts for the segments and calculating a filtered error-count for each one of the segments. The filtered error-count is an average of the raw error-counts for F of the segments, where F is a positive integer equal to a predetermined filter-level, wherein the F of the segments are adjacent to each other. The computer method further comprises determining that one of the segments is erasure and generating the erasure feedback signal for the one of the segments if the filtered error-count for the one of the segments exceeds a predetermined erasure feedback threshold. The computer method further comprises determining that data in the codewords is erroneous if the data is located in one of the segments that is determined as erasure. The computer method further comprises filtering errors caused by additive white Gaussian noise from the input.

In another feature, the computer method further comprises receiving the input signal, forecasting erasure in the input signal, generating an erasure feed-forward signal based on the erasure parameters and the error-detection thresholds, and generating codewords based on the erasure feed-forward signal and the input signal. The computer method further comprises de-mapping the input signal, generating a plurality of de-mapped signals, comparing the de-mapped signals to the error-detection thresholds, and generating an error signal that indicates that the input signal is one of erroneous and not erroneous. The computer method further comprises generating the erasure feed-forward signal based on at least one of the error signal, one of the erasure parameters, and one of the error-detection thresholds. The computer method further comprises generating the codewords based on the de-mapped signals and the erasure feed-forward signal. The computer method further comprises determining erasure in the input signal using one of a cyclic code and a Reed-Solomon code. The computer method further comprises determining that the input signal is one of erroneous and not erroneous based on at least one of the erasure feed-forward signal and the erasure feedback signal.

In another feature, the computer method further comprises burst error trapping (BET) wherein burst errors are detected in a plurality of codewords of the input signal using one of a Reed-Solomon code and a cyclic code. The burst errors are detected if determining that the input signal is one of erroneous and not erroneous fails. The burst errors are detected if forecasting erasure in the input signal fails based on at least one of the erasure feed-forward signal and the erasure feedback signal. The computer method further comprises providing a linear feedback shift register (LFSR) having R registers, where R is a positive integer that is a measure of redundancy in the codewords. The computer method further comprises loading one of the codewords into the LFSR, shifting the LFSR N times, where N is a positive integer equal to a length of the codewords, and determining that the one of the codewords is not erroneous if the R registers have remainders equal to zero. The computer method further comprises loading one of the codewords into the LFSR, shifting the LFSR N times, where N is a positive integer equal to a length of the codewords, appending the LFSR with N zeros, and performing additional N shifts. The computer method further comprises determining that the input signal is erroneous if a number of leading zeros in one of the R registers having a maximum number of leading zeros after the additional N shifts exceeds a predetermined BET threshold. The computer method further comprises forecasting a location of one of the burst errors based on R, N, and a number of one of the additional N shifts that generates the maximum number of leading zeros. The computer method of further comprises outputting results of the BET if determining that the input signal is one of erroneous and not erroneous fails. The computer method further comprises outputting results of the BET if one of the burst errors is detected in one of the codewords.

In another feature, a communication system based on one of a very high bit rate digital subscriber line (VDSL) and VDSL2, comprises the computer method.

In still other features, an erasure forecasting system comprises a control module that selects erasure parameters and that determines error-detection thresholds for forecasting erasure in an input signal. The erasure forecasting system comprises an erasure decoder that determines that the input signal is one of erroneous and not erroneous based on the erasure parameters and the error-detection thresholds. The erasure forecasting system comprises a burst error trapping (BET) module that selectively detects burst errors in the input signal if the erasure decoder determines that the input signal is erroneous.

In another feature, a system comprises the erasure forecasting system, wherein the system includes at least one of error-logs, design specifications, and performance specifications of the system, and wherein the control module selects the erasure parameters and the error-detection thresholds based on at least one of the error-logs, the design specifications, and the performance specifications of the system.

In another feature, the BET module comprises an encoder that uses one of a Reed-Solomon code and a cyclic code. The control module activates the BET module if the erasure decoder fails to determine that the input signal is one of erroneous and not erroneous. The BET module comprises a linear feedback shift register (LFSR) having R registers, where R is a positive integer that is a measure of redundancy in a plurality of codewords of the input signal. The BET module loads one of the codewords into the LFSR, shifts the LFSR N times, where N is a positive integer equal to a length of the codewords, and determines that the one of the codewords is not erroneous if the R registers have remainders equal to zero. The BET module loads one of the codewords into the LFSR, shifts the LFSR N times, where N is a positive integer equal to a length of the codewords, appends the LFSR with N zeros, and performs additional N shifts. The BET module determines that the input signal is erroneous if a number of leading zeros in one of the R registers having a maximum number of leading zeros after the additional N shifts exceeds a BET threshold predetermined by the control module. The BET module forecasts a location of one of the burst errors based on R, N, and a number of one of the additional N shifts that generates the maximum number of leading zeros. The erasure forecasting system further comprises an overwrite module that writes an output of the BET module over an output of the erasure decoder if the erasure decoder fails to determine that the input signal is one of erroneous and not erroneous. The erasure forecasting system further comprises an overwrite module that writes an output of the BET module over an output of the erasure decoder if the BET module detects one of the burst errors.

In another feature, the erasure forecasting system further comprises an erasure feed-forward module that receives the input signal, that forecasts erasure in the input signal, that generates an erasure feed-forward signal based on the erasure parameters and the error-detection thresholds, and that generates codewords based on the erasure feed-forward signal and the input signal. The erasure feed-forward module further comprises a de-mapper module that de-maps the input signal, that generates a plurality of de-mapped signals, that compares the de-mapped signals to the error-detection thresholds, and that generates an error signal that indicates that the input signal is one of erroneous and not erroneous. A configuration module that generates the erasure feed-forward signal based on at least one of the error signal, one of the erasure parameters, and one of the error-detection thresholds. A formatter module that generates the codewords based on the de-mapped signals and the erasure feed-forward signal. The erasure decoder determines that the input signal is one of erroneous and not erroneous based on the erasure feed-forward signal. The control module activates the BET module if the erasure feed-forward module fails to forecast erasure in the input signal. The erasure decoder uses one of a cyclic code and a Reed-Solomon code to determine erasure in the input signal.

In another feature, the erasure forecasting system further comprises an erasure feedback module that forecasts erasure in the input signal and that generates an erasure feedback signal based on erasure information derived from the erasure decoder. The erasure forecasting system further comprises a de-interleaver module that de-interleaves codewords of the input signal in a plurality of segments based on a length of the codewords, a predetermined interleave factor, and a predetermined interleave depth. The erasure feedback module calculates raw error-counts for the segments and calculates a filtered error-count for each one of the segments. The filtered error-count is an average of the raw error-counts for F of the segments, where F is a positive integer equal to a filter-level predetermined by the control module, wherein the F of the segments are adjacent to each other. The erasure feedback module determines that one of the segments is erasure and generates the erasure feedback signal for the one of the segments if the filtered error-count for the one of the segments exceeds an erasure feedback threshold predetermined by the control module. The erasure decoder determines that data in the codewords is erroneous if the data is located in one of the segments that is determined as erasure by the erasure feedback module. The erasure forecasting system filters errors caused by additive white Gaussian noise from the input. The erasure decoder determines that the input signal is one of erroneous and not erroneous based on the erasure feedback signal. The control module activates the BET module if the erasure feedback module fails to forecast erasure in the input signal.

In another feature, a communication system based on one of a very high bit rate digital subscriber line (VDSL) and VDSL2, comprises the erasure forecasting system.

In still other features, a method for erasure forecasting comprises selecting erasure parameters, determining error-detection thresholds for forecasting erasure in an input signal, determining that the input signal is one of erroneous and not erroneous based on the erasure parameters and the error-detection thresholds, and burst error trapping (BET) comprises selectively detecting burst errors in the input signal if the input signal is erroneous.

In another feature, the method further comprises selecting the erasure parameters and the error-detection thresholds based on at least one of error-logs, design specifications, and performance specifications of a system.

In another feature, the method further comprises detecting the burst errors using one of a Reed-Solomon code and a cyclic code. The method further comprises detecting the burst errors if determining that the input signal is one of erroneous and not erroneous fails. The method further comprises detecting the burst errors by providing a linear feedback shift register (LFSR) having R registers, where R is a positive integer that is a measure of redundancy in a plurality of codewords of the input signal. The method further comprises loading one of the codewords into the LFSR, shifting the LFSR N times, where N is a positive integer equal to a length of the codewords, and determining that the one of the codewords is not erroneous if the R registers have remainders equal to zero. The method further comprises loading one of the codewords into the LFSR, shifting the LFSR N times, where N is a positive integer equal to a length of the codewords, appending the LFSR with N zeros, and performing additional N shifts. The method further comprises determining that the input signal is erroneous if a number of leading zeros in one of the R registers having a maximum number of leading zeros after the additional N shifts exceeds a predetermined BET threshold. The method further comprises forecasting a location of one of the burst errors based on R, N, and a number of one of the additional N shifts that generates the maximum number of leading zeros. The method further comprises outputting results of the BET if determining that the input signal is one of erroneous and not erroneous fails. The method further comprises outputting results of the BET if one of the burst errors is detected.

In another feature, the method further comprises receiving the input signal, forecasting erasure in the input signal, generating an erasure feed-forward signal based on the erasure parameters and the error-detection thresholds, and generating codewords based on the erasure feed-forward signal and the input signal. The method further comprises de-mapping the input signal, generating a plurality of de-mapped signals, comparing the de-mapped signals to the error-detection thresholds, and generating an error signal that indicates that the input signal is one of erroneous and not erroneous. The method further comprises generating the erasure feed-forward signal based on at least one of the error signal, one of the erasure parameters, and one of the error-detection thresholds. The method further comprises generating the codewords based on the de-mapped signals and the erasure feed-forward signal. The method further comprises determining that the input signal is one of erroneous and not erroneous based on the erasure feed-forward signal. The method further comprises detecting the burst errors if forecasting erasure in the input signal based on the erasure feed-forward signal fails. The method further comprises determining erasure in the input signal using one of a cyclic code and a Reed-Solomon code.

In another feature, the method further comprises forecasting erasure in the input signal and generating an erasure feedback signal. The method further comprises de-interleaving codewords of the input signal in a plurality of segments based on a length of the codewords, a predetermined interleave factor, and a predetermined interleave depth. The method further comprises calculating raw error-counts for the segments and calculating a filtered error-count for each one of the segments. The filtered error-count is an average of the raw error-counts for F of the segments, where F is a positive integer equal to a predetermined filter-level, wherein the F of the segments are adjacent to each other. The method further comprises determining that one of the segments is erasure and generating the erasure feedback signal for the one of the segments if the filtered error-count for the one of the segments exceeds a predetermined erasure feedback threshold. The method further comprises determining that data in the codewords is erroneous if the data is located in one of the segments that is determined as erasure. The method further comprises filtering errors caused by additive white Gaussian noise from the input. The method further comprises determining that the input signal is one of erroneous and not erroneous based on the erasure feedback signal. The method further comprises detecting the burst errors if forecasting erasure in the input signal based on the erasure feedback signal fails.

In another feature, a communication system based on one of a very high bit rate digital subscriber line (VDSL) and VDSL2, comprises the method.

In still other features, an erasure forecasting system comprises control means for selecting erasure parameters and determining error-detection thresholds for forecasting erasure in an input signal. The erasure forecasting system comprises erasure decoder means for determining that the input signal is one of erroneous and not erroneous based on the erasure parameters and the error-detection thresholds. The erasure forecasting system comprises burst error trapping (BET) means for selectively detecting burst errors in the input signal if the erasure decoder means determines that the input signal is erroneous.

In another feature, a system comprises the erasure forecasting system, wherein the system includes at least one of error-logs, design specifications, and performance specifications of the system, and wherein the control means selects the erasure parameters and the error-detection thresholds based on at least one of the error-logs, the design specifications, and the performance specifications of the system.

In another feature, the BET means comprises an encoder means for using one of a Reed-Solomon code and a cyclic code. The control means activates the BET means if the erasure decoder means fails to determine that the input signal is one of erroneous and not erroneous. The BET means comprises a linear feedback shift register (LFSR) having R registers, where R is a positive integer that is a measure of redundancy in a plurality of codewords of the input signal. The BET means loads one of the codewords into the LFSR, shifts the LFSR N times, where N is a positive integer equal to a length of the codewords, and determines that the one of the codewords is not erroneous if the R registers have remainders equal to zero. The BET means loads one of the codewords into the LFSR, shifts the LFSR N times, where N is a positive integer equal to a length of the codewords, appends the LFSR with N zeros, and performs additional N shifts. The BET means determines that the input signal is erroneous if a number of leading zeros in one of the R registers having a maximum number of leading zeros after the additional N shifts exceeds a BET threshold predetermined by the control means. The BET means forecasts a location of one of the burst errors based on R, N, and a number of one of the additional N shifts that generates the maximum number of leading zeros. The erasure forecasting system further comprises overwrite means for writing an output of the BET means over an output of the erasure decoder means if the erasure decoder means fails to determine that the input signal is one of erroneous and not erroneous. The erasure forecasting system further comprises overwrite means for writing an output of the BET means over an output of the erasure decoder means if the BET means detects one of the burst errors.

In another feature, the erasure forecasting system further comprises erasure feed-forward means for receiving the input signal, forecasting erasure in the input signal, generating an erasure feed-forward signal based on the erasure parameters and the error-detection thresholds, and generating codewords based on the erasure feed-forward signal and the input signal. The erasure feed-forward means further comprises de-mapper means for de-mapping the input signal, generating a plurality of de-mapped signals, comparing the de-mapped signals to the error-detection thresholds, and generating an error signal that indicates that the input signal is one of erroneous and not erroneous. The erasure forecasting system further comprises configuration means for generating the erasure feed-forward signal based on at least one of the error signal, one of the erasure parameters, and one of the error-detection thresholds. The erasure forecasting system further comprises formatter means for generating the codewords based on the de-mapped signals and the erasure feed-forward signal. The erasure decoder means determines that the input signal is one of erroneous and not erroneous based on the erasure feed-forward signal. The control means activates the BET means if the erasure feed-forward means fails to forecast erasure in the input signal. The erasure decoder means uses one of a cyclic code and a Reed-Solomon code to determine erasure in the input signal.

In another feature, the erasure forecasting system further comprises erasure feedback means for forecasting erasure in the input signal and generating an erasure feedback signal based on erasure information derived from the erasure decoder means. The erasure forecasting system further comprises de-interleaver means for de-interleaving codewords of the input signal in a plurality of segments based on a length of the codewords, a predetermined interleave factor, and a predetermined interleave depth. The erasure feedback means calculates raw error-counts for the segments and calculates a filtered error-count for each one of the segments. The filtered error-count is an average of the raw error-counts for F of the segments, where F is a positive integer equal to a filter-level predetermined by the control means, wherein the F of the segments are adjacent to each other. The erasure feedback means determines that one of the segments is erasure and generates the erasure feedback signal for the one of the segments if the filtered error-count for the one of the segments exceeds an erasure feedback threshold predetermined by the control means. The erasure decoder means determines that data in the codewords is erroneous if the data is located in one of the segments that is determined as erasure by the erasure feedback means. The erasure forecasting system filters errors caused by additive white Gaussian noise from the input. The erasure decoder means determines that the input signal is one of erroneous and not erroneous based on the erasure feedback signal. The control means activates the BET means if the erasure feedback means fails to forecast erasure in the input signal.

In another feature, a communication system based on one of a very high bit rate digital subscriber line (VDSL) and VDSL2, comprises the erasure forecasting system.

In still other features, a computer method for erasure forecasting comprises selecting erasure parameters, determining error-detection thresholds for forecasting erasure in an input signal, determining that the input signal is one of erroneous and not erroneous based on the erasure parameters and the error-detection thresholds, and burst error trapping (BET) comprises selectively detecting burst errors in the input signal if the input signal is erroneous.

In another feature, the computer method further comprises selecting the erasure parameters and the error-detection thresholds based on at least one of error-logs, design specifications, and performance specifications of a system.

In another feature, the computer method further comprises detecting the burst errors using one of a Reed-Solomon code and a cyclic code. The computer method further comprises detecting the burst errors if determining that the input signal is one of erroneous and not erroneous fails. The computer method further comprises detecting the burst errors by providing a linear feedback shift register (LFSR) having R registers, where R is a positive integer that is a measure of redundancy in a plurality of codewords of the input signal. The computer method further comprises loading one of the codewords into the LFSR, shifting the LFSR N times, where N is a positive integer equal to a length of the codewords, and determining that the one of the codewords is not erroneous if the R registers have remainders equal to zero. The computer method further comprises loading one of the codewords into the LFSR, shifting the LFSR N times, where N is a positive integer equal to a length of the codewords, appending the LFSR with N zeros, and performing additional N shifts. The computer method further comprises determining that the input signal is erroneous if a number of leading zeros in one of the R registers having a maximum number of leading zeros after the additional N shifts exceeds a predetermined BET threshold. The computer method further comprises forecasting a location of one of the burst errors based on R, N, and a number of one of the additional N shifts that generates the maximum number of leading zeros. The computer method further comprises outputting results of the BET if determining that the input signal is one of erroneous and not erroneous fails. The computer method further comprises outputting results of the BET if one of the burst errors is detected.

In another feature, the computer method further comprises receiving the input signal, forecasting erasure in the input signal, generating an erasure feed-forward signal based on the erasure parameters and the error-detection thresholds, and generating codewords based on the erasure feed-forward signal and the input signal. The computer method further comprises de-mapping the input signal, generating a plurality of de-mapped signals, comparing the de-mapped signals to the error-detection thresholds, and generating an error signal that indicates that the input signal is one of erroneous and not erroneous. The computer method further comprises generating the erasure feed-forward signal based on at least one of the error signal, one of the erasure parameters, and one of the error-detection thresholds. The computer method further comprises generating the codewords based on the de-mapped signals and the erasure feed-forward signal. The computer method further comprises determining that the input signal is one of erroneous and not erroneous based on the erasure feed-forward signal. The computer method further comprises detecting the burst errors if forecasting erasure in the input signal based on the erasure feed-forward signal fails. The computer method further comprises determining erasure in the input signal using one of a cyclic code and a Reed-Solomon code.

In another feature, the computer method further comprises forecasting erasure in the input signal and generating an erasure feedback signal. The computer method further comprises de-interleaving codewords of the input signal in a plurality of segments based on a length of the codewords, a predetermined interleave factor, and a predetermined interleave depth. The computer method further comprises calculating raw error-counts for the segments and calculating a filtered error-count for each one of the segments. The filtered error-count is an average of the raw error-counts for F of the segments, where F is a positive integer equal to a predetermined filter-level, wherein the F of the segments are adjacent to each other. The computer method further comprises determining that one of the segments is erasure and generating the erasure feedback signal for the one of the segments if the filtered error-count for the one of the segments exceeds a predetermined erasure feedback threshold. The computer method further comprises determining that data in the codewords is erroneous if the data is located in one of the segments that is determined as erasure. The computer method further comprises filtering errors caused by additive white Gaussian noise from the input. The computer method further comprises determining that the input signal is one of erroneous and not erroneous based on the erasure feedback signal. The computer method further comprises detecting the burst errors if forecasting erasure in the input signal fails.

In another feature, a communication system based on one of a very high bit rate digital subscriber line (VDSL) and VDSL2, comprises the computer method.

In still other features, an erasure forecasting system comprises a control module that selects erasure parameters and that determines error-detection thresholds for forecasting erasure in an input signal. The erasure forecasting system comprises an erasure feed-forward module that receives the input signal, that forecasts erasure in the input signal, that generates an erasure feed-forward signal based on the erasure parameters and the error-detection thresholds, and that generates codewords based on the erasure feed-forward signal and the input signal. The erasure forecasting system comprises an erasure decoder that determines that the input signal is one of erroneous and not erroneous selectively based on the erasure feed-forward signal. The erasure forecasting system comprises an erasure feedback module that forecasts erasure in the input signal based on erasure information derived from the erasure decoder and that generates an erasure feedback signal that the erasure decoder uses to determine whether the input signal is one of erroneous and not erroneous. The erasure forecasting system comprises a burst error trapping (BET) module that selectively detects burst errors in the input signal based on at least one of whether the erasure decoder determines that the input signal is erroneous, the erasure feed-forward signal, and the erasure feedback signal.

In another feature, a system comprises the erasure forecasting system, wherein the system includes at least one of error-logs, design specifications, and performance specifications of the system, and wherein the control module selects the erasure parameters and the error-detection thresholds based on at least one of the error-logs, the design specifications, and the performance specifications of the system.

In another feature, the erasure feed-forward module further comprises a de-mapper module that de-maps the input signal, that generates a plurality of de-mapped signals, that compares the de-mapped signals to the error-detection thresholds, and that generates an error signal that indicates that the input signal is one of erroneous and not erroneous. A configuration module that generates the erasure feed-forward signal based on at least one of the error signal, one of the erasure parameters, and one of the error-detection thresholds. A formatter module that generates the codewords based on the de-mapped signals and the erasure feed-forward signal. The erasure decoder uses one of a cyclic code and a Reed-Solomon code to determine erasure in the input signal.

In another feature, the erasure forecasting system further comprises a de-interleaver module that de-interleaves the codewords in a plurality of segments based on a length of the codewords, a predetermined interleave factor, and a predetermined interleave depth. The erasure feedback module calculates raw error-counts for the segments and calculates a filtered error-count for each one of the segments. The filtered error-count is an average of the raw error-counts for F of the segments, where F is a positive integer equal to a filter-level predetermined by the control module, wherein the F of the segments are adjacent to each other. The erasure feedback module determines that one of the segments is erasure and generates the erasure feedback signal for the one of the segments if the filtered error-count for the one of the segments exceeds an erasure feedback threshold predetermined by the control module. The erasure decoder determines that data in the codewords is erroneous if the data is located in one of the segments that is determined as erasure by the erasure feedback module. The erasure forecasting system filters errors caused by additive white Gaussian noise from the input. The erasure decoder determines that the input signal is one of erroneous and not erroneous based on at least one of the erasure feed-forward signal and the erasure feedback signal.

In another feature, the BET module comprises an encoder that uses one of a Reed-Solomon code and a cyclic code. The control module activates the BET module if the erasure decoder fails to determine that the input signal is one of erroneous and not erroneous. The control module activates the BET module if at least one of the erasure feed-forward module and the erasure feedback module fails to forecast erasure in the input signal. The BET module comprises a linear feedback shift register (LFSR) having R registers, where R is a positive integer that is a measure of redundancy in the codewords. The BET module loads one of the codewords into the LFSR, shifts the LFSR N times, where N is a positive integer equal to a length of the codewords, and determines that the one of the codewords is not erroneous if the R registers have remainders equal to zero. The BET module loads one of the codewords into the LFSR, shifts the LFSR N times, where N is a positive integer equal to a length of the codewords, appends the LFSR with N zeros, and performs additional N shifts. The BET module determines that the input signal is erroneous if a number of leading zeros in one of the R registers having a maximum number of leading zeros after the additional N shifts exceeds a BET threshold predetermined by the control module. The BET module forecasts a location of one of the burst errors based on R, N, and a number of one of the additional N shifts that generates the maximum number of leading zeros. The erasure forecasting system further comprises an overwrite module that writes an output of the BET module over an output of the erasure decoder if the erasure decoder fails to determine that the input signal is one of erroneous and not erroneous. The erasure forecasting system further comprises an overwrite module that writes an output of the BET module over an output of the erasure decoder if the BET module detects one of the burst errors in one of the codewords.

In another feature, a communication system based on one of a very high bit rate digital subscriber line (VDSL) and VDSL2, comprises the erasure forecasting system.

In still other features, a method for erasure forecasting comprises selecting erasure parameters, determining error-detection thresholds for forecasting erasure in an input signal, receiving the input signal, forecasting erasure in the input signal, generating an erasure feed-forward signal based on the erasure parameters and the error-detection thresholds, generating codewords based on the erasure feed-forward signal and the input signal, determining that the input signal is one of erroneous and not erroneous selectively based on the erasure feed-forward signal, forecasting erasure in the input signal based on whether the input signal is one of erroneous and not erroneous, generating an erasure feedback signal that is used to determine that the input signal is one of erroneous and not erroneous, and burst error trapping (BET) comprises selectively detecting burst errors in the input signal based on at least one of whether the input signal is erroneous, the erasure feed-forward signal, and the erasure feedback signal.

In another feature, the method further comprises selecting the erasure parameters and the error-detection thresholds based on at least one of error-logs, design specifications, and performance specifications of a system.

In another feature, the method further comprises de-mapping the input signal, generating a plurality of de-mapped signals, comparing the de-mapped signals to the error-detection thresholds, and generating an error signal that indicates that the input signal is one of erroneous and not erroneous. The method further comprises generating the erasure feed-forward signal based on at least one of the error signal, one of the erasure parameters, and one of the error-detection thresholds. The method further comprises generating the codewords based on the de-mapped signals and the erasure feed-forward signal. The method further comprises determining erasure in the input signal using one of a cyclic code and a Reed-Solomon code.

In another feature, the method further comprises de-interleaving the codewords in a plurality of segments based on a length of the codewords, a predetermined interleave factor, and a predetermined interleave depth. The method further comprises calculating raw error-counts for the segments and calculating a filtered error-count for each one of the segments. The filtered error-count is an average of the raw error-counts for F of the segments, where F is a positive integer equal to a predetermined filter-level, wherein the F of the segments are adjacent to each other. The method further comprises determining that one of the segments is erasure and generating the erasure feedback signal for the one of the segments if the filtered error-count for the one of the segments exceeds a predetermined erasure feedback threshold. The method further comprises determining that data in the codewords is erroneous if the data is located in one of the segments that is determined as erasure. The method further comprises filtering errors caused by additive white Gaussian noise from the input. The method further comprises determining that the input signal is one of erroneous and not erroneous based on at least one of the erasure feed-forward signal and the erasure feedback signal.

In another feature, the method further comprises detecting the burst errors using one of a Reed-Solomon code and a cyclic code. The method further comprises detecting the burst errors if determining that the input signal is one of erroneous and not erroneous fails. The method further comprises detecting the burst errors if forecasting erasure in the input based on at least one of the erasure feed-forward signal and the erasure feedback signal fails. The method further comprises detecting the burst errors by providing a linear feedback shift register (LFSR) having R registers, where R is a positive integer that is a measure of redundancy in the codewords. The method further comprises loading one of the codewords into the LFSR, shifting the LFSR N times, where N is a positive integer equal to a length of the codewords, and determining that the one of the codewords is not erroneous if the R registers have remainders equal to zero. The method further comprises loading one of the codewords into the LFSR, shifting the LFSR N times, where N is a positive integer equal to a length of the codewords, appending the LFSR with N zeros, and performing additional N shifts. The method further comprises determining that the input signal is erroneous if a number of leading zeros in one of the R registers having a maximum number of leading zeros after the additional N shifts exceeds a predetermined BET threshold. The method further comprises forecasting a location of one of the burst errors based on R, N, and a number of one of the additional N shifts that generates the maximum number of leading zeros. The method further comprises outputting results of the BET if determining that the input signal is one of erroneous and not erroneous fails. The method further comprises outputting results of the BET if one of the burst errors is detected.

In another feature, a communication system based on one of a very high bit rate digital subscriber line (VDSL) and VDSL2, comprises the method.

In still other features, an erasure forecasting system comprises control means for selecting erasure parameters and determining error-detection thresholds for forecasting erasure in an input signal. The erasure forecasting system comprises erasure feed-forward means for receiving the input signal, forecasting erasure in the input signal, generating an erasure feed-forward signal based on the erasure parameters and the error-detection thresholds, and generating codewords based on the erasure feed-forward signal and the input signal. The erasure forecasting system comprises erasure decoder means for determining that the input signal is one of erroneous and not erroneous selectively based on the erasure feed-forward signal. The erasure forecasting system comprises erasure feedback means for forecasting erasure in the input signal based on erasure information derived from the erasure decoder means and generating an erasure feedback signal that the erasure decoder means uses to determine whether the input signal is one of erroneous and not erroneous. The erasure forecasting system comprises burst error trapping (BET) means for selectively detecting burst errors in the input signal based on at least one of whether the erasure decoder means determines that the input signal is erroneous, the erasure feed-forward signal, and the erasure feedback signal.

In another feature, a system comprises the erasure forecasting system, wherein the system includes at least one of error-logs, design specifications, and performance specifications of the system, and wherein the control means selects the erasure parameters and the error-detection thresholds based on at least one of the error-logs, the design specifications, and the performance specifications of the system.

In another feature, the erasure feed-forward means further comprises de-mapper means for de-mapping the input signal, generating a plurality of de-mapped signals, comparing the de-mapped signals to the error-detection thresholds, and generating an error signal that indicates that the input signal is one of erroneous and not erroneous. The erasure forecasting system further comprises configuration means for generating the erasure feed-forward signal based on at least one of the error signal, one of the erasure parameters, and one of the error-detection thresholds. The erasure forecasting system further comprises formatter means for generating the codewords based on the de-mapped signals and the erasure feed-forward signal. The erasure decoder means uses one of a cyclic code and a Reed-Solomon code to determine erasure in the input signal.

In another feature, the erasure forecasting system further comprises de-interleaver means for de-interleaving the codewords in a plurality of segments based on a length of the codewords, a predetermined interleave factor, and a predetermined interleave depth. The erasure feedback means calculates raw error-counts for the segments and calculates a filtered error-count for each one of the segments. The filtered error-count is an average of the raw error-counts for F of the segments, where F is a positive integer equal to a filter-level predetermined by the control means, wherein the F of the segments are adjacent to each other. The erasure feedback means determines that one of the segments is erasure and generates the erasure feedback signal for the one of the segments if the filtered error-count for the one of the segments exceeds an erasure feedback threshold predetermined by the control means. The erasure decoder means determines that data in the codewords is erroneous if the data is located in one of the segments that is determined as erasure by the erasure feedback means. The erasure forecasting system filters errors caused by additive white Gaussian noise from the input. The erasure decoder means determines that the input signal is one of erroneous and not erroneous based on at least one of the erasure feed-forward signal and the erasure feedback signal.

In another feature, the BET means comprises an encoder means for using one of a Reed-Solomon code and a cyclic code. The control means activates the BET means if the erasure decoder means fails to determine that the input signal is one of erroneous and not erroneous. The control means activates the BET means if at least one of the erasure feed-forward means and the erasure feedback means fails to forecast erasure in the input signal. The BET means comprises a linear feedback shift register (LFSR) having R registers, where R is a positive integer that is a measure of redundancy in the codewords. The BET means loads one of the codewords into the LFSR, shifts the LFSR N times, where N is a positive integer equal to a length of the codewords, and determines that the one of the codewords is not erroneous if the R registers have remainders equal to zero. The BET means loads one of the codewords into the LFSR, shifts the LFSR N times, where N is a positive integer equal to a length of the codewords, appends the LFSR with N zeros, and performs additional N shifts. The BET means determines that the input signal is erroneous if a number of leading zeros in one of the R registers having a maximum number of leading zeros after the additional N shifts exceeds a BET threshold predetermined by the control means. The BET means forecasts a location of one of the burst errors based on R, N, and a number of one of the additional N shifts that generates the maximum number of leading zeros. The erasure forecasting system further comprises overwrite means for writing an output of the BET means over an output of the erasure decoder means if the erasure decoder means fails to determine that the input signal is one of erroneous and not erroneous. The erasure forecasting system further comprises overwrite means for writing an output of the BET means over an output of the erasure decoder means if the BET means detects one of the burst errors in one of the codewords.

In another feature, a communication system based on one of a very high bit rate digital subscriber line (VDSL) and VDSL2, comprises the erasure forecasting system.

In still other features, a computer method for erasure forecasting comprises selecting erasure parameters, determining error-detection thresholds for forecasting erasure in an input signal, receiving the input signal, forecasting erasure in the input signal, generating an erasure feed-forward signal based on the erasure parameters and the error-detection thresholds, generating codewords based on the erasure feed-forward signal and the input signal, determining that the input signal is one of erroneous and not erroneous selectively based on the erasure feed-forward signal, forecasting erasure in the input signal based on whether the input signal is one of erroneous and not erroneous, generating an erasure feedback signal that is used to determine that the input signal is one of erroneous and not erroneous, and burst error trapping (BET) comprises selectively detecting burst errors in the input signal based on at least one of whether the input signal is erroneous, the erasure feed-forward signal, and the erasure feedback signal.

In another feature, the computer method further comprises selecting the erasure parameters and the error-detection thresholds based on at least one of error-logs, design specifications, and performance specifications of a system.

In another feature, the computer method further comprises de-mapping the input signal, generating a plurality of de-mapped signals, comparing the de-mapped signals to the error-detection thresholds, and generating an error signal that indicates that the input signal is one of erroneous and not erroneous. The computer method further comprises generating the erasure feed-forward signal based on at least one of the error signal, one of the erasure parameters, and one of the error-detection thresholds. The computer method further comprises generating the codewords based on the de-mapped signals and the erasure feed-forward signal. The computer method further comprises determining erasure in the input signal using one of a cyclic code and a Reed-Solomon code.

In another feature, the computer method further comprises de-interleaving the codewords in a plurality of segments based on a length of the codewords, a predetermined interleave factor, and a predetermined interleave depth. The computer method further comprises calculating raw error-counts for the segments and calculating a filtered error-count for each one of the segments. The filtered error-count is an average of the raw error-counts for F of the segments, where F is a positive integer equal to a predetermined filter-level, wherein the F of the segments are adjacent to each other. The computer method further comprises determining that one of the segments is erasure and generating the erasure feedback signal for the one of the segments if the filtered error-count for the one of the segments exceeds a predetermined erasure feedback threshold. The computer method further comprises determining that data in the codewords is erroneous if the data is located in one of the segments that is determined as erasure. The computer method further comprises filtering errors caused by additive white Gaussian noise from the input. The computer method further comprises determining that the input signal is one of erroneous and not erroneous based on at least one of the erasure feed-forward signal and the erasure feedback signal.

In another feature, the computer method further comprises detecting the burst errors using one of a Reed-Solomon code and a cyclic code. The computer method further comprises detecting the burst errors if determining that the input signal is one of erroneous and not erroneous fails. The computer method further comprises detecting the burst errors if forecasting erasure in the input based on at least one of the erasure feed-forward signal and the erasure feedback signal fails. The computer method further comprises detecting the burst errors by providing a linear feedback shift register (LFSR) having R registers, where R is a positive integer that is a measure of redundancy in the codewords. The computer method further comprises loading one of the codewords into the LFSR, shifting the LFSR N times, where N is a positive integer equal to a length of the codewords, and determining that the one of the codewords is not erroneous if the R registers have remainders equal to zero. The computer method further comprises loading one of the codewords into the LFSR, shifting the LFSR N times, where N is a positive integer equal to a length of the codewords, appending the LFSR with N zeros, and performing additional N shifts. The computer method further comprises determining that the input signal is erroneous if a number of leading zeros in one of the R registers having a maximum number of leading zeros after the additional N shifts exceeds a predetermined BET threshold. The computer method further comprises forecasting a location of one of the burst errors based on R, N, and a number of one of the additional N shifts that generates the maximum number of leading zeros. The computer method further comprises outputting results of the BET if determining that the input signal is one of erroneous and not erroneous fails. The computer method further comprises outputting results of the BET if one of the burst errors is detected.

In another feature, a communication system based on one of a very high bit rate digital subscriber line (VDSL) and VDSL2, comprises the computer method.

In still other features, the systems and methods described above are implemented by a computer program executed by one or more processors. The computer program can reside on a computer readable medium such as but not limited to memory, non-volatile data storage and/or other suitable tangible storage mediums.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1A:
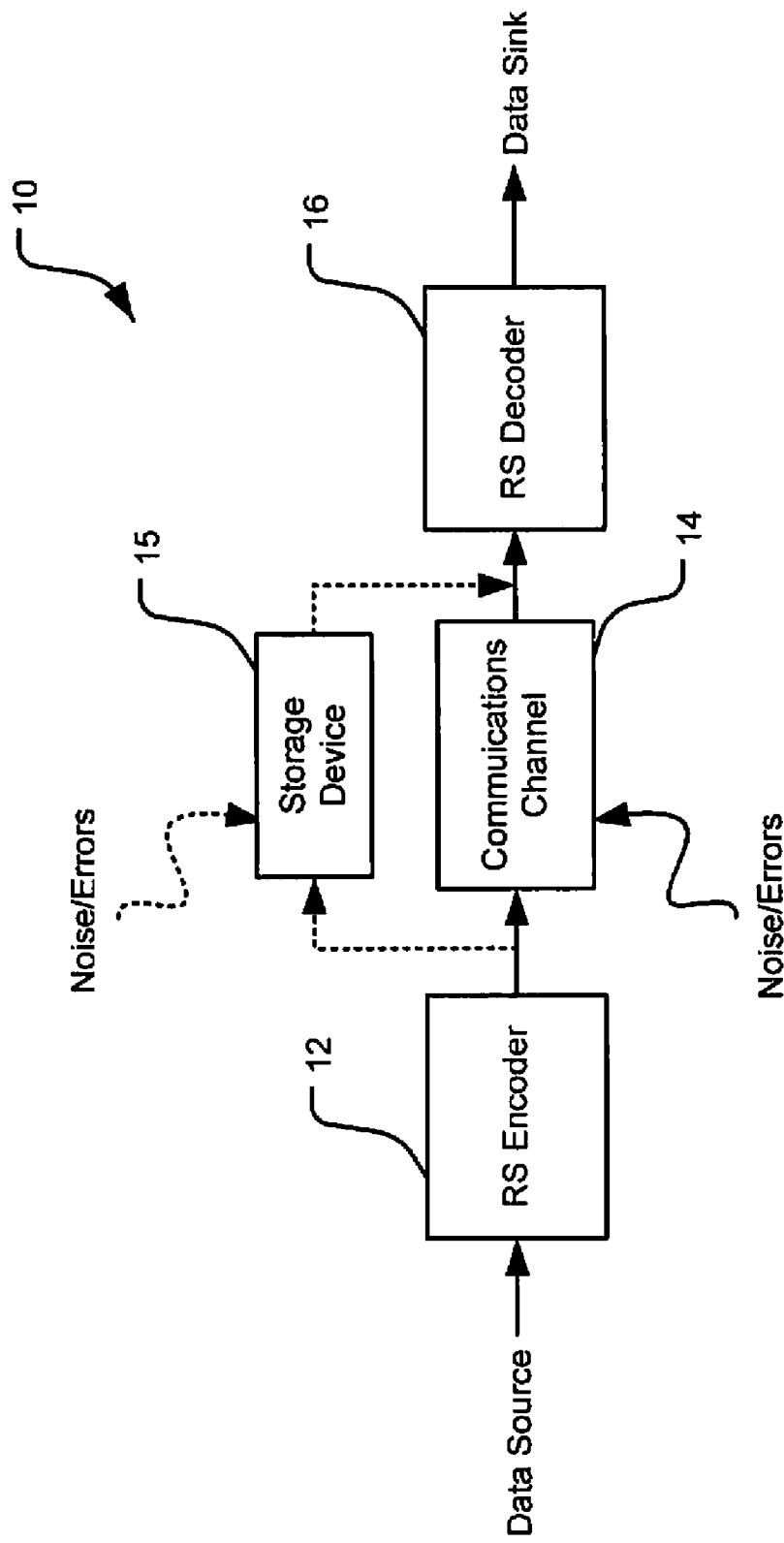
FIG. 1A is a functional block diagram of a Reed-Solomon code-based error-correction system for correcting data errors according to the prior art.
Figure 1B:
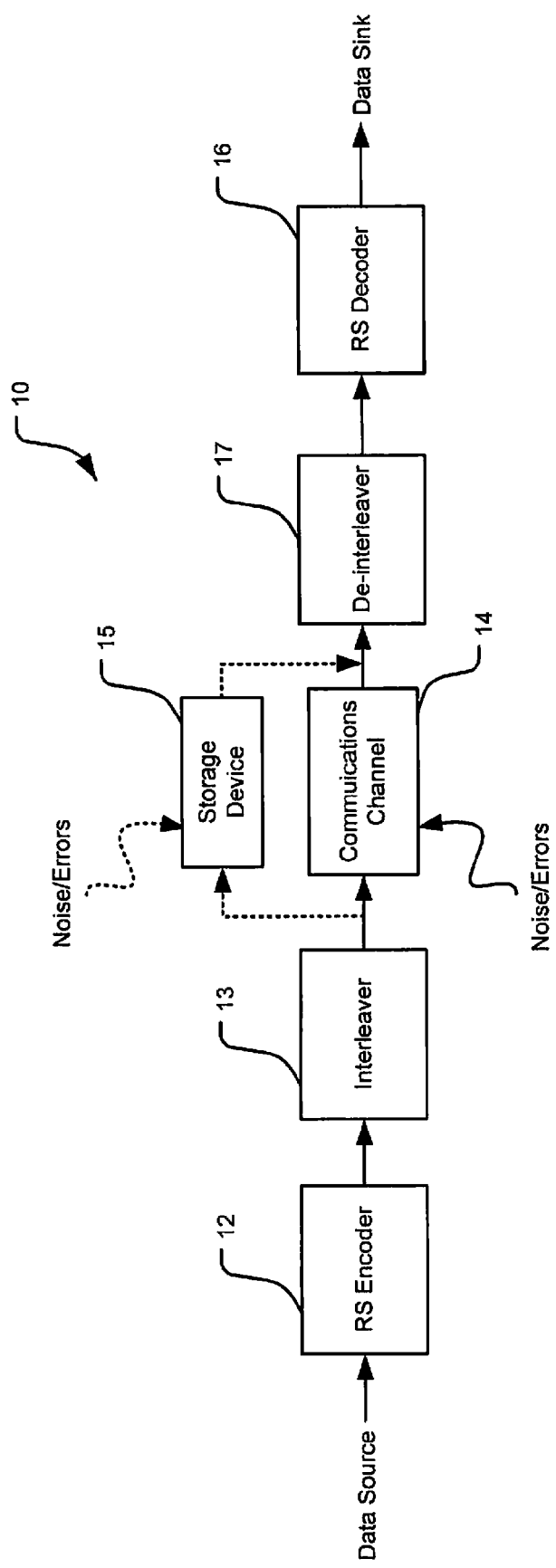
FIG. 1B is a functional block diagram of a Reed-Solomon code-based error correction system incorporating an interleaving scheme to correct burst errors according to the prior art.
Figure 2:
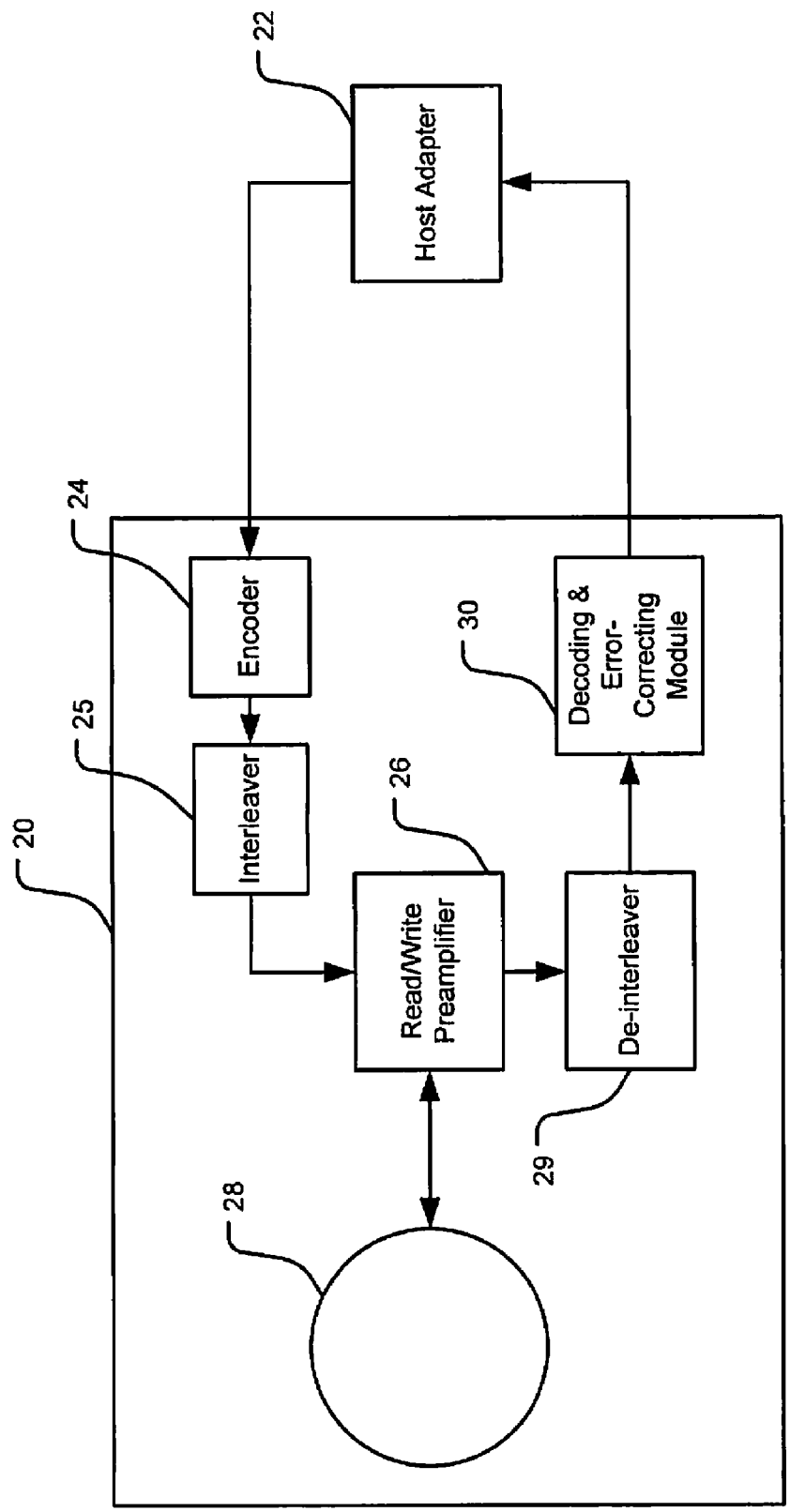
FIG. 2 is a functional block diagram of a mass-storage device that uses an interleaving, decoding, and error-correcting scheme to correct data errors according to the prior art.
Figure 3:
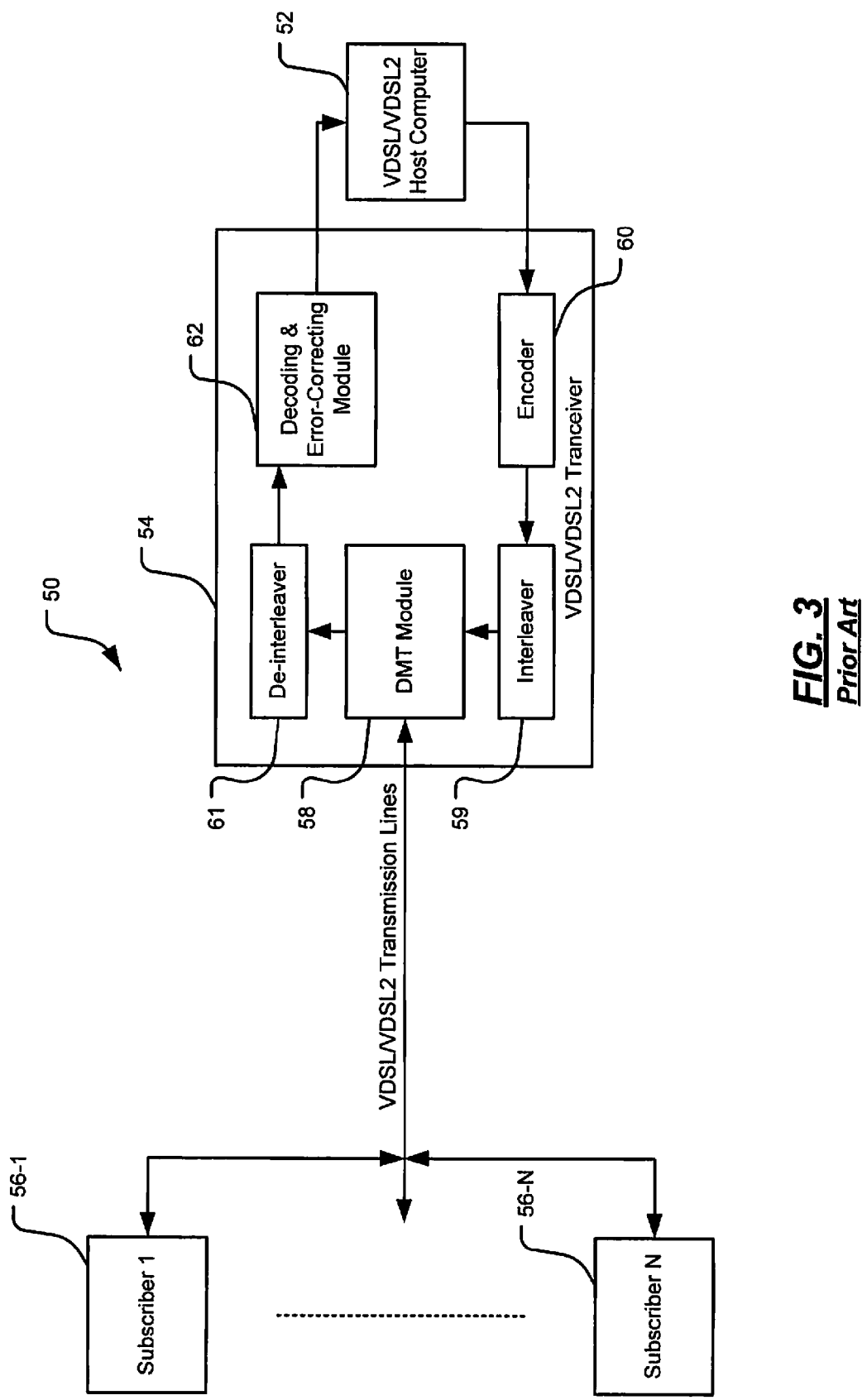
FIG. 3 is a functional block diagram of a VDSL/VDSL2-based communication system that uses an interleaving, decoding, and error-correcting scheme to correct data errors according to the prior art.

The following description of the preferred embodiment(s) is merely exemplary in nature and is in no way intended to limit the invention, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present invention.

Error-correction requires determining two variables: an error location and an error value. Generally, data errors caused by additive white Gaussian noise (AWGN) occur randomly. Therefore, error locations and error values for AWGN errors are unknown. On the other hand, errors caused by instantaneous changes in system environment occur in bursts. Errors that occur in bursts are sometimes repetitive. Therefore, error locations of burst errors may be predicted once an error pattern is known. Predicting error locations based on a known pattern of error occurrence is known as erasure forecasting. Accurately predicting error locations simplifies error-correction because error value remains as the only unknown variable to be determined.

Errors in high-capacity mass-storage devices, high-bandwidth communication systems such as those utilizing VDSL2, etc., generally occur in bursts. Therefore, erasure forecasting can significantly improve the decoding and error-correcting capabilities of a Reed-Solomon (RS) code utilized by the decoding and error-correcting schemes used in such systems.

An erasure decoder may be used to extend the error-correction capability of the RS code. In some systems, some "side information", such as the locations of the erroneous bytes can be reasonably predicted and fed to the RS decoder. These erroneous bytes are treated as "erasures" instead of "errors." When erasures are known, any combination of errors and erasures can be corrected if $2E+S \leq R$, where E is the number of errors and S is the number of erasures in a data block.

By properly predicting and labeling the erasures, the RS decoder can theoretically recover up to R erroneous bytes in one RS codeword. This error-correction capability is twice that of systems that do not use erasure predictions. This characteristic makes the RS code and a properly designed RS decoder particularly suitable to correct errors that occur in bursts because the RS decoder can treat the burst of consecutive errors as a single string of erasures with a leading burst location.

Specifically, some erasure or "side information" about burst errors is available at system level. For example, a host adapter or a computer communicating with a mass-storage device may log locations of bad sectors, bad tracks, bad cylinders, etc., in the device. Similarly, in a VDSL/VDSL2-based communication system, a host computer may log information such as channels that have been flagged as noisy due to excessive burst error rates, an interleave scheme used by a decoding and error-correcting scheme used by the system, etc.

This known erasure can be used to estimate reliability of a byte of input data received by a decoding and error-correcting module. An erasure forecast (EF) flag can be generated and attached to the byte to indicate an estimate or a probability that the byte may be erroneous or error-free. Whether the decoding and error-correcting module correctly decodes and corrects errors depends on whether the EF flag is correctly generated.

Generally, a combined error and erasure correction capability of a RS decoder is limited by the equation $S+2*E \leq R$, where S=number of erasure flags set, E=extra number of errors not flagged, and R=check redundancy (e.g., R=0, 2, 4, . . . , 16 for VDSL). When $S+2*E>R$, that is, when the number of errors is excessive, the RS decoder stops correcting errors and outputs data without decoding. This is called decoding failure, and the RS decoder sets a flag (e.g., undec) to indicate that the output data is undecoded.

If erasure forecasting is used aggressively, that is, if S is very high, error-correcting properties of R can diminish. For example, the RS decoder may even inject more errors into the data instead of correcting errors when S+2*E>R. This condition is called mis-decoding. This type of overly aggressive erasure forecasting is called erasure false alarms and can actually hurt the built-in error-correction capability. Erasure false alarms can be minimized by diversifying R and by setting the EF flag upon considering a large number of factors.

For example, in a VDLS/VDLS2-based communication system, an erasure forecasting and error-correction system can be designed by considering factors such as channel characteristics, system target information, parameters to be tuned/set, etc. Channel characteristics may include erasure information available at system level such as impulse noise period (INP), interleave depth (D), input byte error rate (input BER), a loss of sync detection, a wide band noise detection, a narrow band low SNR detection for certain sub-channels, etc. This erasure information can be readily obtained from a host computer utilized by the communication system.

System target information may include parameters such as maximizing throughput, optimizing output BER and frame error rate (FER), etc. Being typical design parameters of the communication system, this information is also readily available. Finally, parameters that can be tuned/set by the system software may include S_Max or maximum number of erasures allowed to be set (flagged), filter settings, threshold settings, etc.

Additionally, the erasure forecasting and error-correction system can be designed to ensure overall reliability and flexibility. Reliability can be achieved by designing the system so as to decrease erasure false alarm rate and increase erasure detection rate. Flexibility can be achieved by designing the system such that the system is software-controlled, easy to configure, simulation driven, and capable of being monitored, tested, tuned, and self-adapted in the field.

Specifically, erasure forecasting (EF) uses a combination of erasure forecasting feed forward (EFFF) and/or erasure forecasting feedback (EFFB) schemes. EFFF comprises high-level erasure feed-forward forecasting (EFFF_HL) and per tone erasure feed-forward forecasting (EFFF_PT). Each EF (EFFF_HL, EFFF_PT, and EFFB) scheme can be configured and tuned using threshold settings that generally depend on channel characteristics and noise margin settings. Software can pre-simulate and pre-load a threshold profile per channel characteristic and noise margin setting. Each EF scheme can be individually turned on and off. The erasure forecasting and error-correction system is designed such that when any EF is turned on, overall performance is at least as good as when the EF is turned off. Additionally, a burst error trapping (BET) technique is used as a complementary backup system instead of or in addition to EFFF and/or EFFB.

Figure 4:
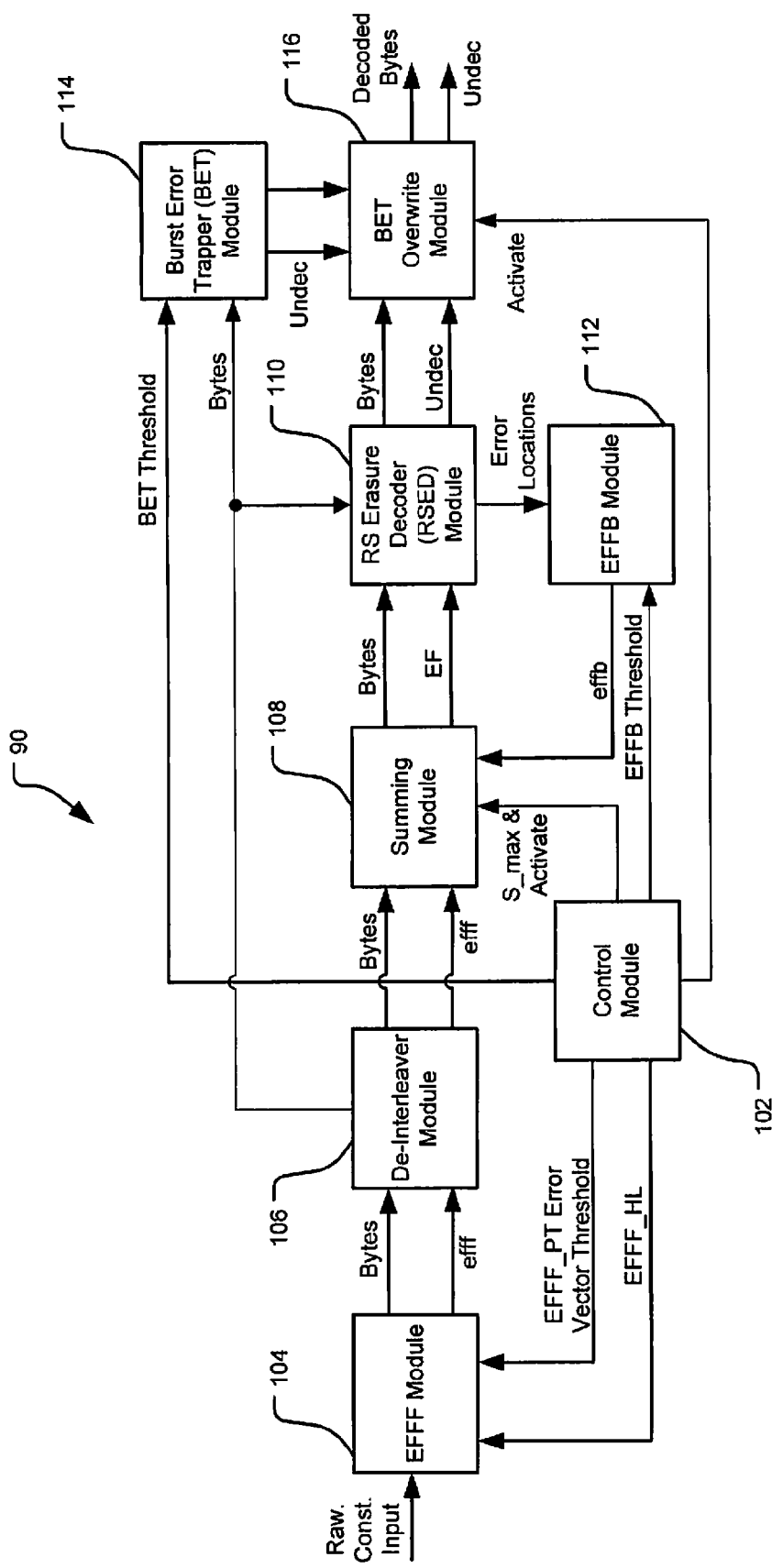
FIG. 4 is a functional block diagram of an exemplary system for erasure forecasting and error-correction according to the present invention.

Referring now to FIG. 4, a system 90 for erasure forecasting and error-correction utilizes Erasure Forecasting Feed Forward (EFFF), Erasure Forecasting Feed Back (EFFB), and Burst Error Trapping (BET) schemes. The EFFF further comprises high-level EFFF (EFFF_HL) and per tone EFFF (EFFF_PT). The system 90 comprises a control module 102, an EFFF module 104, a de-interleaver module 106, a summing module 108, a RS erasure decoder (RSED) module 110, an EFFB module 112, a BET module 114, and a BET overwrite module 116.

The EFFF module 104 receives input data that is to be demodulated or decoded. The input data may contain errors that may require detection and correction. The control module 102 provides EFFF_HL and EFFF_PT erasure threshold information to the EFFF module 104. Based on that information, the EFFF module 104 generates an erasure forecast feed-forward (efff) flag. The EFFF module 104 attaches the efff flag to each demodulated or decoded byte of the input data to generate a spread codeword and forwards the spread codeword to the de-interleaver module 106. The de-interleaver module 106 de-spreads the spread codeword back into consecutive byte order. Additionally, the de-interleaver module 106 spreads and partitions the burst errors into multiple regions or segments. Output of the de-interleaver module 106 is fed to the RSED module 110 and the BET module 114.

The summing module 108 is activated by a control signal generated by the control module 102. The summing module 108 adds the efff flag to an erasure forecast feedback (effb) flag output by the EFFB module 112. The summing module 108 generates an erasure forecast (EF) flag based on the efff and/or effb flag and a summing threshold setting S_Max. If the total number of erasure flags are greater than S_Max, the summing module 108 passes only the first S_Max number of erasure flags to the RSED module 110. This feature can decrease the erasure false alarm rate. The EF flag reflects a more accurate erasure forecast for the input byte than that provided by the efff flag or by the effb flag.

The RSED module 110 decodes errors from the codewords output by the de-interleaver module 106 using the EF flag generated by the summing module 108. The RSED module 110 outputs decoded codewords to the BET overwrite module 116. If S+2*E>R, the RSED module 110 sets an undec flag to indicate that the RSED module 110 failed to decode errors due to excessive error rate and that the output of the RSED module 110 is undecoded.

The EFFB module 112 calculates raw and filtered error-scores for each region based on the error location information derived from the RSED module 110 and the system information about the interleaver. The EFFB module 112 compares the filtered scores with an EFFB threshold (effb_th) set by the control module 102. The EFFB module 112 generates an erasure forecast feedback (effb) flag for each region and tags a region as erasure if a filtered score for the region exceeds effb_th. The effb flag is fed back to the RSED module 110 via the summing module 108. The effb flag informs the RSED module 110 in advance that a byte of a subsequent codeword, if located in a flagged region, may be erroneous.

The BET module 114 detects burst errors that may be present in the codewords output by the de-interleaver module 106. The control module 102 enables BET when the RSED undec flag is set and provides the BET module 114 with a threshold BET_th to trap burst errors. The BET module 114 utilizes a linear feedback shift register (LFSR) to locate burst errors. The BET module 114 traps the location of the burst error and corrects the current codeword output by the de-interleaver module 106 when the RSED module 110 declares the output as undecoded.

The BET overwrite module 116 receives the output of the RSED module 110 and the output of the BET module 114. The BET overwrite module 116 uses the data received from the BET module 114 to overwrite the data received from the RSED module 110 when the RSED undec flag is set or when BET_th is exceeded. Otherwise, the BET overwrite module 116 outputs the decoded bytes received from the RSED module 110. The BET overwrite module 116 outputs undecoded data if neither the RSED module 110 nor the BET module 114 can successfully correct the current codeword within the threshold setting enabled by the control module 102.

More specifically, the control module 102 provides the EFFF module 104 erasure information denoted by EFFF_HL and EFFF_PT. Based on that erasure information, the EFFF module 104 generates an efff flag that is added to each byte of input data received. The efff flag is essentially a binary forecast of whether a byte of the input data is erroneous or error-free.

The control module 102 derives EFFF_HL or high-level erasure information from various sources such as a host computer. For example, in the VDSL/VDSL2-based communication system, the control module 102 may derive from the VDSL/VDSL2 host computer such statistics as status of some of the channels, RS frame error rate (FER), packet drop rate, loss of sync, loss of signal, ADC over/under flow, DSM/PSD feedback, etc.

This erasure or EFFF_HL can be used to estimate accuracy of the input byte and to assign a measure of reliability to each input byte received by the EFFF module 104. EFFF_HL is essentially a reliability measurement of a transmission line. EFFF_HL can be used to tag an entire DMT symbol (wide band) or to tag only some impaired bands (narrowband) with erasure forecast flags. EFFF_HL may be updated per DMT sync interval.

Figure 5:
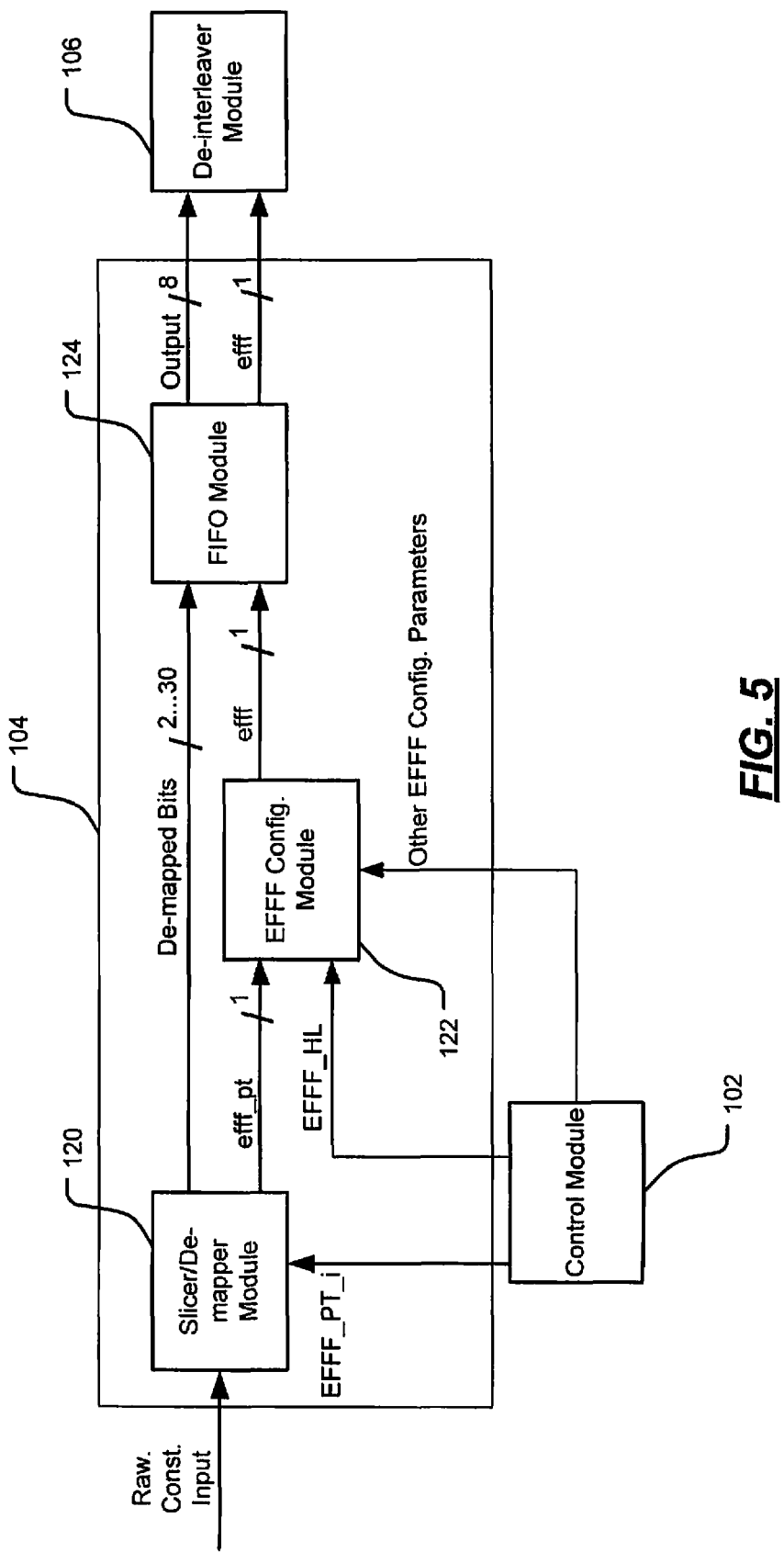
FIG. 5 is a functional block diagram of an exemplary erasure forecast feed-forward (EFFF) scheme for erasure forecasting and error-correction according to the present invention.

Referring now to FIG. 5, the EFFF module 104 comprises a slicer/de-mapper module 120, an EFFF configuration module 122, and a FIFO module 124. The slicer/de-mapper module 120 converts an input raw constellation to a de-mapped constellation based on EFFF_PT error vector thresholds per tone set by the control module 102. The slicer/de-mapper module 120 generates a per tone erasure forecast flag (efff_pt) that is fed to the EFFF configuration module 122.

The EFFF configuration module 122 generates an erasure flag efff based on efff_pt, EFFF_HL, and other configuration parameters provided by the control module 102. The FIFO module 124 converts an output of the slicer/de-mapper module 120 into a byte format so that the de-interleaver module 106, which can process information in byte format, can process the output of the slicer/de-mapper module 120.

More specifically, the slicer/de-mapper module 120 compares an error vector for an input raw constellation to an EFFF_PT error vector threshold to determine whether an erasure flag efff_pt should be set. An error vector is a distance from an input raw constellation to a de-mapped constellation. For every input raw constellation, the control module 102 derives an error vector from sources such as per tone signal-to-noise ratio (SNR) data.

Since each tone may have different bit-loading, the control module 102 generates different error vector thresholds such as EFFF_PT_1, . . . , EFFPT_15. The control module 102 provides EFFF_PT_i (i=1, . . . , 15) to the slicer/de-mapper module 120. If an error vector is substantially less than a threshold, the efff_pt flag is reset to zero, and efff_pt erasure is disregarded. Otherwise, the erasure flag efff_pt is set to 1 and is added to each of the de-mapped tone bits per tone. For example, for a tone with 15-bit loading, the efff_pt flag is added to each of 15 de-mapped tone bits.

The EFFF configuration module 122 enables the control module 102 to flexibly configure and control the parameters that determine whether the efff flag should be set. For example, the control module 102 provides the EFFF configuration module 122 with EFFF_HL and other EFFF configuration parameters such as HL_active, PT_active, DMT_wipeout, EFFF_and_or, etc.

EFFF_HL is a high-level (i.e., system-level) erasure forecast parameter that can forecast either wide band noise or narrow-band noise. EFFF_HL essentially indicates status of a number of bands. The EFFF configuration module 122 can use this information as a factor in deciding whether to generate the efff flag. By generating the efff flag based on EFFF_HL, the EFFF configuration module 122 effectively indicates that only the bands with errors be wiped out.

On the other hand, DMT_wipeout is a system-level parameter that can forecast wide-band noise. DMT_wipeout has one bit and is updated per DMT sync interval. The EFFF configuration module 122 can use DMT_wipeout as a factor in deciding whether to generate the efff flag. By generating the efff flag based on DMT_wipeout, the EFFF configuration module 122 effectively indicates that the entire DMT symbol be wiped out.

Finally, the parameter EFFF_and_or informs the EFFF configuration module 122 whether the control module 102 is using EFFF_HL and/or EFFF_PT for erasure forecasting. EFFF_and_or is set to 1 if both EFFF_HL and EFFF_PT are active. EFFF and or is reset to zero if EFFF_HL is active or EFFF_PT is active.

The slicer/de-mapper module 120 can operate on per-two-tone basis (4D Wei's code) or per-four-tone basis (4 one bit tone loading). Consequently, the output of the slicer/de-mapper module 120 can have multiple de-mapped tone-bits. Additionally, the erasure flag efff is tagged to every de-mapped tone-bit (or every other de-mapped tone-bit depending on implementation). But the de-interleaver module 106, which processes the output of the EFFF module 104, processes inputs that are in bytes or in 8-bit format. Therefore, a FIFO module 124 is used to convert the multi-bit output of the slicer/demapper module 120 to a codeword comprising multiple 8-bit bytes.

For example, for a first tone with 10-bit loading with an erasure flag attached (denoted by /1) and a second tone with 9-bit loading with no erasure flag attached (denoted by /0), the de-mapped bits/efff that are input to the FIFO module 124 will be . . . , (a9/1, a8/1, a7/1, a6/1, a5/1, a4/1, a3/1, a2/1, a1/1, a0/1), (b8/0, b7/0, b6/0, b5/0, b4/0, b3/0, b2/0, b1/0, b0/0), . . . . Corresponding output/efff of the FIFO module 124 will be ( . . . )/1, (a8, a7, a6, a5, a4, a3, a2, a1)/1, (a0, b8, b7, b6, b5, b4, b3, b2)/1, (b1,b0, . . . )/0, . . . . Thus, the erasure flag is attached per bit before FIFO, and the erasure flag is attached per byte after FIFO.

Figure 6:
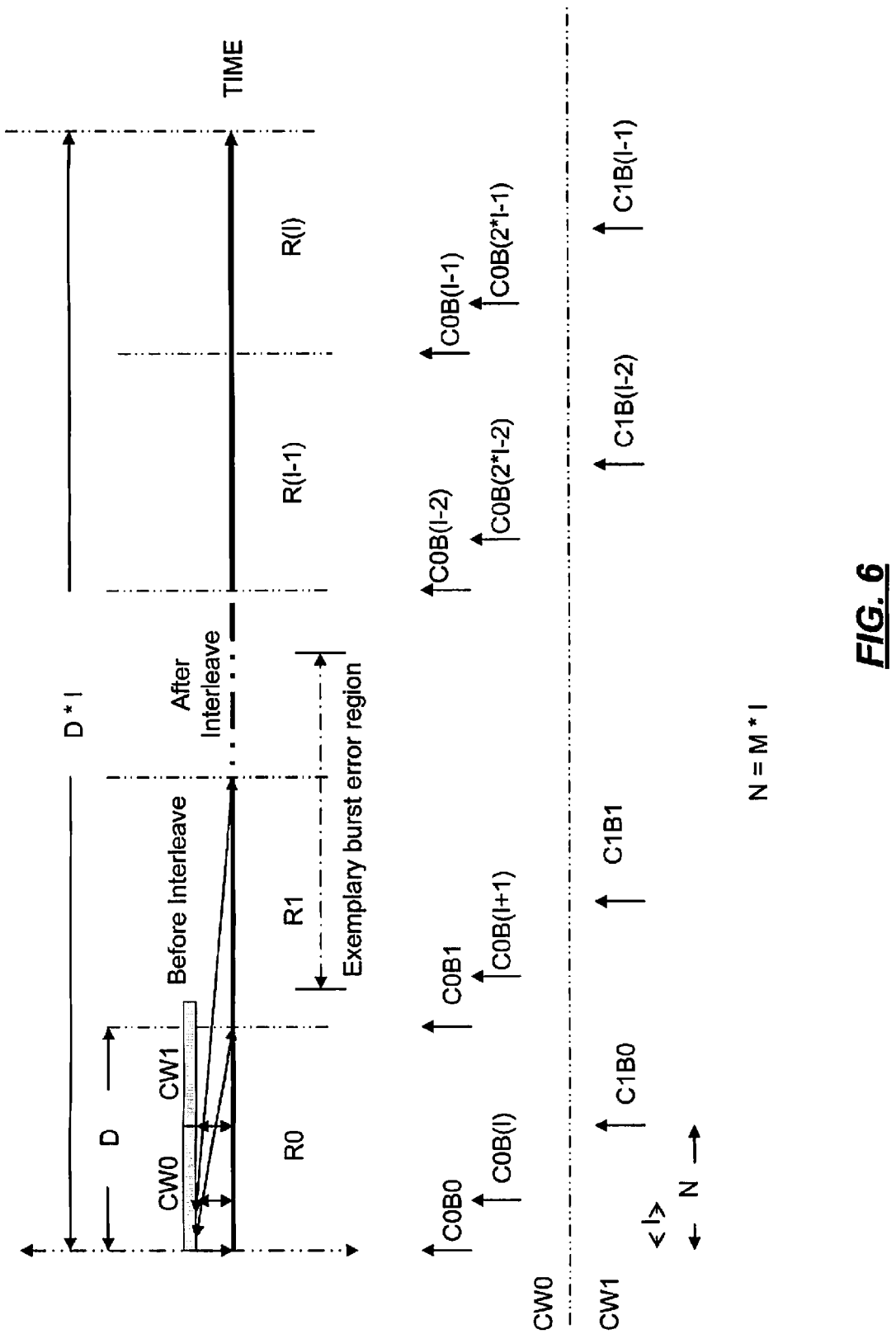
FIG. 6 illustrates operation of an exemplary de-interleaver according to the present invention.

Referring now to FIG. 6, the de-interleaver module 106 spreads or partitions a codeword (de-mapped bytes/efff) into different regions or segments $R_0, \ldots, R_1$, etc. For example, when codeword width N is less than interleave depth D (i.e., when N<D), a first byte $B_0$ of a first codeword $C_0$ of width N bytes (byte $C_0B_0$), is located in region $R_0$ at time 0. A second byte $B_1$ of the first codeword $C_0$ (i.e., byte $C_0B_1$) is delayed by time D and is located in region $R_1$. A next byte $C_0B_2$ is delayed by time 2*D and is located in region $R_2$, and so on.

If an interleave factor I is a multiple M of the codeword width N (i.e., N=M*I) and an $I^{th}$ byte of the codeword $C_0$ (i.e., byte $C_0B_I$) is located in region $R_0$, then byte $C_0B_{I+1}$ will be delayed by time (I+D), and so on. If a time slot from time 0 to time D*(I−1) is partitioned into I regions $R_0$, R1, . . . , $R_{I-1}$, then bytes $C_0B_0$, $C_0B_I$, $C_0B_{2*1}$, . . . will be located in region $R_0$. Similarly, bytes $C_0B_1$, $C_0B_{(I+1)}$, $C_0B_{(2*I+1)}$, . . . will be located in region $R_1$. Thus, byte $C_0B_Y$ will be located in region Z where Z=Y mod I.

A first byte $B_1$ of a next codeword $C_1$ (i.e., byte $C_1B_0$) is delayed by N bytes relative to $C_0B_0$ and will be located in a region with a number equal to a remainder of N/D. Thus, the codeword $C_1$ is so offset and delayed that bytes of codeword $C_1$ follow a region-pattern similar to the codeword $C_0$.

If the RSED module 110 decodes a byte $C_XB_Y$ in region Z as an error, the entire region Z may possibly be erroneous and might need to be tagged as erasure region. If, however, the error is caused by additive white Gaussian noise (AWGN), which occurs randomly, tagging the region aggressively as erasure region may result in erasure false alarm or mis-detecting and may cause a decoding failure. Therefore, AWGN errors need to be distinguished from burst errors, and erasure forecasting should not be performed if errors are caused by AWGN.

The EFFB module 112 filters AWGN errors and generates erasure forecast feedback (effb) flag as follows. Each region is assigned a raw score that denotes a number of errors in that region. For example, raw_score$_0$ represents number of errors in region R$_0$, raw_score$_1$ represents number of errors in region R$_1$, ..., raw_score$_{I-1}$ represents number of errors in region R$_{I-1}$. The raw scores are reset to zero before beginning each decoding cycle. If byte Y of codeword X in region Z (i.e., byte C$_X$B$_Y$), where Z=Y mod I, is decoded as an error, where Y=0, ..., (N−1), then raw_score$_Z$ is incremented by 1.

At the end of a decoding cycle, a filtered score for each region is calculated by adding raw scores of a predetermined number of adjacent regions, where the number of adjacent regions is selected based on a desired filter level set by the control module 102. For example, with a filter level of three, a filtered score for region K is calculated as follows.

Filtered_score$_K$=raw_score$_{K-1}$+ raw_score$_K$+raw_score$_{K+1}$

Since region$_{I-1}$ has no successor, a filtered score for region$_{I-1}$ is calculated as follows.

Filtered_score$_{I-1}$=raw_score$_{I-2}$+2*raw_score$_{I-1}$

Similarly, since region$_0$ has no predecessor, a filtered score for region$_0$ is calculated as follows.

Filtered_score$_0$=2*raw_score$_0$+raw_score$_1$ or

Filtered_score$_0$=Old_last_score+ raw_score$_0$+raw_score$_1$ where old_last_score is the raw_score$_{N-1}$ of the last decoded codeword.

The EFFB module 112 tags a region$_I$ as erasure if filtered_score$_I$≦effb_th, where effb_th is the threshold set by the control module 102. The EFFB module 112 tags the region, as erasure by setting a flag effb_pre$_I$=1. When effb_pre$_I$ is fed back to the RSED module 110 via the summing module 108, an error status of a byte of a subsequent codeword located in region, can be accurately predicted or forecast as erroneous. Accordingly, the RSED module 110 decodes the byte of the subsequent codeword located in region, as error.

Since AWGN errors generally occur randomly, the probability that such errors will occur in adjacent regions is low. On the other hand, since burst errors generally occur over a time period that may span adjacent regions, an average of raw scores of adjacent regions, if high, may indicate that the errors are caused by an error burst and not by AWGN. Thus, by tagging only those regions that have filtered scores higher than the threshold effb_th as erasure, AWGN errors are filtered out.

By properly setting effb_th, AWGN errors can be substantially filtered out. Since N=M*I, AWGN filtering can be improved by increasing M (i.e., by decreasing interleave factor I). Since the number of filter stages depends on M and memory size depends on I, a proper value of M can be chosen by considering hardware trade-offs.

Similar reliability measurement (effb_pre) can be assigned to each region in time domain starting at time 0 to time D*(I−1). Since a subsequent codeword is delayed by N relative to a current codeword that is being decoded, a first byte of next codeword will be located in region W, where value of W is equal to a remainder of (N/D). If effb_pre$_W$=1, then set effb$_0$=1. Similarly, second byte of next codeword is tagged with effb$_1$=effb_pre$_{W+1}$. Thus, effb$_{I*M+K}$=effb_pre$_{W+K}$ for M=0, ..., (M−1) and (I*M+K)=0, ..., (N−1−W). The last byte in region W is unmapped. Setting that byte to zero may result in a conservative erasure forecast. Instead, setting that byte to effb_pre$_{I-1}$ may result in an aggressive erasure forecast.

When the interleave factor I is greater than the interleave depth D (i.e., I>D) or when the codeword width N is greater than the interleave depth D (i.e., N>D), byte C$_0$B$_I$ may be located in a region other than R$_0$. Nonetheless, erasure forecast can be provided using the same EFFB algorithm as when N<D. For example, byte C$_0$B$_I$ may be presumed to be located in region R$_0$, and raw_score$_0$ may be incremented. Any discrepancy that may result due to the presumption can be compensated by setting a filter level that is higher than the filter level when N<D. That is, raw scores of more adjacent regions may be averaged to arrive at filtered scores for each region. Erasure forecast achieved using this strategy is approximately as accurate as that when N<D, and the strategy does not require additional hardware.

Alternatively, the EFFB module 112 can use another strategy to provide an accurate erasure forecast when N>D or I>D. Let N=M*I. I=IDI*D+IDF, where IDI=Integer part of (I/D) and IDF=Remainder of (I/D). N=NDI*D+NDF, where NDI=Integer part of (N/D) and NDF=Remainder of (N/D). The EFFB module 112 calculates raw scores and filtered scores, performs threshold comparisons, and generates erasure forecast as follows.

Let RI=region number, RF=number of a bytes in a region (maximum=D), X=number of rows of regions, Y=number of bytes in each row, and B=byte number in an N-byte codeword. Initially, RI, RF, and B are reset to 0. Additionally, raw_score$_X$ is reset to 0 for all regions 0≦X≦(I+NDI). Following sequence is performed to calculate raw score of each region.

For 0≦X<M, X=X+1; (Increment row count)
  For 0≦Y<I, Y=Y+1; (Increment byte count)
  B=X*M+Y;
  If byte B has error, raw_score$_{RI+Y}$=raw_score$_{RI+Y}$+1;
  B=B+1; (Next byte of codeword)
  RI=RI+IDI; (Offset region number);
  RF=RF+IDF; (Offset number of bytes in region RI);
  If RF D (i.e, if region filled), then RI=RI+1; RF=RF−D.
  (If region RI is filled, increment RI and reduce number of bytes in RI by D).

The control module 102 may set a filter level of 3, 5, 7, .... For example, with a filter level of 3, the EFFB module 112 calculates filtered scores using the following formula.

Filtered_score$_K$=raw_score$_{K-1}$+ raw_score$_K$+raw_score$_{K+1}$

Using a threshold effb_th set by the control module 102, the EFFB module 112 determines erasure as follows.

Effb_pre$_K$=1 if filtered_score$_K$≧effb_th;
  else effb_pre$_K$=0

The EFFB module 112 generates erasure forecast for a next codeword as follows.
Set RI=NDI; RF=NDF; B=0.
For 0≦X<M, X=X+1; (Increment row counter)
  For 0≦Y<I, Y=Y+1; (Increment byte counter)
  For Byte B=X*M+Y, of (B)=pre_effb$_{RI+Y}$;
  B=B+1;
  RI=RI+IDI; RF=RF+IDF;
  IF RF≧D, then RI=RI+1; RF=RF−D.

The control module 102 activates erasure feed forward forecasting (EFFF) and/or erasure feedback forecasting (EFFB) based on values of parameters efff_active and effb_active, respectively. Additionally, the control module 102 uses a parameter ef_and_or to set EF as follows. If ef_and_or =1, set EF only if efff and effb are both active. If ef_and_or =0, set EF if either efff or effb is active.

The BET module 114 utilizes a burst error trapping scheme that can be used as a backup technique to correct errors that are not corrected by the EFFF and/or the EFFB schemes. For example, BET can correct errors when the EFFF and/or EFFB schemes cause false alarms due to improper threshold settings. Additionally, BET can correct errors when the RSED module 110 cannot decode input data because the error rate is excessive (i.e., when S+2*E>R).

Figure 7:
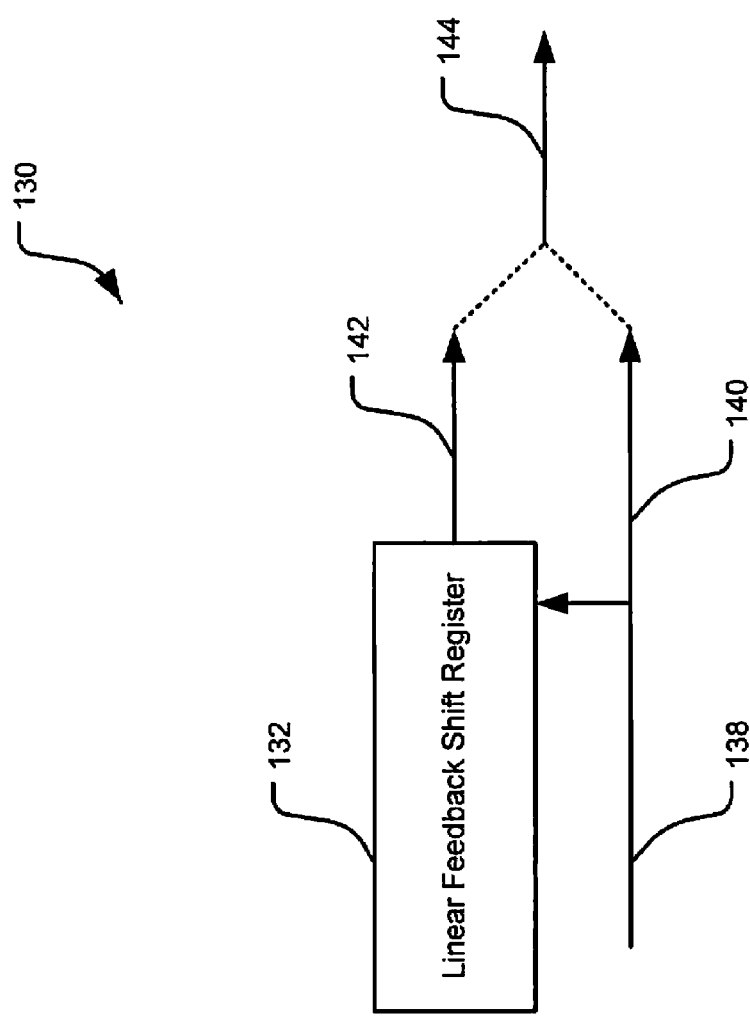
FIG. 7 is a functional block diagram of an exemplary RS encoder used in a burst error trapping (BET) scheme for erasure forecasting and error-correction according to the present invention.

Specifically, BET utilizes the cyclic and linear properties of the RS code to predict burst errors. Referring now to FIG. 7, the BET module 114 utilizes a typical RS encoder 130. The RS encoder 130 comprises a standard linear feedback shift register (LFSR) 132. In an R-byte LFSR, where R=redundancy, an input codeword is shifted from one byte to the next most-significant byte through the R registers per clock cycle.

In a typical RS encoding operation, the R registers are reset to 0 before beginning an encoding cycle. An input 138 to the LFSR 132 comprises K message bytes $M_0, \ldots, M_{K-1}$ that are appended with R zeros, where R=N−K. After K clock cycles (shifts), the content of the R registers represents remainder polynomial. Output 144 of the LFSR 132 is RS encoded data that is a combination of output 140 derived from message path taken after first K cycles and serial output 142 of R registers taken after last R cycles.

BET, on the other hand, uses a different approach. After resetting the R registers, N bytes of a codeword (instead of K message bytes as in RS encoding) are fed to the input 138 of the LFSR 132. After N shifts (instead of K shifts as in RS encoding), the codeword comprising K message bytes and R check bytes is filtered out. Thus, the R registers should contain either zeros or non-zero function of errors, if any. If the R registers contain non-zero function of errors, the errors need to be located (i.e., trapped).

BET traps errors as follows. The LFSR 132 is appended with N zeros (instead of R zeros), and additional N shifts are performed. During each of the additional N shifts, the BET module 114 counts the number of leading zeros in each of the R registers. At the end of the additional N shifts, the register with maximum number of leading zeros should contain a burst error. At this point, the error is said to be trapped, and the register with maximum number of leading zeros is latched. For example, at cycle X, if the register Rx has a maximum number of leading zeros Y and if the rest of the registers have (R−Y) non-zeros, then a burst error pattern Z in the current codeword can be forecast as starting at location (N−X) and as being of error pattern Z with length (R−Y).

A wrong forecast may cause a false alarm. The probability of a forecast being wrong, and therefore of a false alarm, is a function of the number of leading zeros. For example, the probability of false alarm is 1 out of $2^8$ for 1 leading zero, 1 out of $2^{16}$ for 2 leading zeros, 1 out of $2^{24}$ for 3 leading zeros, and so on. Additionally, since AWGN is random and is substantially filtered out previously by the EFFB module 112, the probability that the trapped error is caused by AWGN is very low.

The control module 102 sets a threshold BET_th equal to a predetermined number of leading zeros. The BET module 114 infers an error if the maximum number of leading zeros in the latched register exceeds BET_th. BET_th can be varied from 0 to R. BET_th can also be adjusted (tuned) to minimize the probability of false alarms.

The BET overwrite module 116 receives the output of the RSED module 110 that may be undecoded or that may be decoded and error-corrected using efff and/or effb. Additionally, the BET overwrite module 116 receives the output of the BET module 114 if BET is enabled by the control module 102.

The BET overwrite module 116 outputs the decoded and error-corrected data output by the RSED module 110 when RSED undec flag is not set. The BET overwrite module 116 uses the data received from the BET module 114 to overwrite the data received from the RSED module 110 when the undec flag is set or when the BET_th is exceeded. The BET overwrite module 116 outputs the undecoded data output by the RSED module 110 when none of the EF schemes is enabled by the control module 102.

A mathematical proof for BET follows. Let G=Generator, M=Message, K=Message Length, C=Check (redundancy), N=Codeword Length, T=Transmit, R=Receive, E=Error, B=Burst Error, S=Burst Start, L=Burst Length, and N'=Remainder in BET. A transmit polynomial for a RS code is expressed by the following equation.

$$T(X) = M(X)^{N-K} + C(X) = 0 \bmod G(X)$$

In RS encoding, after K shift cycles, a remainder in a LFSR is expressed by the following equation.

$$N(X) = M(X)^{N-K} \bmod G(X)$$

Received data is a combination of transmitted data and errors, if any. That is, R(X)=T(X)+E(X). A burst error can be mathematically expressed by the following equation.

$$E(X) = B_0 X^S + B_1 X^{S+1} + \ldots + B_{L-1} X^{S+L-1} = B(X) * X^S$$

In BET, after N shift cycles, the remainder in the LFSR is expressed by the following equation.

$$N'(X) = R(X) \bmod G(X)$$

Substituting R(X)=T(X)+E(X), we get $$N'(X) = (T(X) + E(X)) \bmod G(X)$$

Expanding, we get $$N'(X) = T(X) \bmod G(X) + E(X) \bmod G(X)$$

Substituting T(X) mod G(X)=0 since the codeword is filtered out after N shifts, we get $$N'(X) = E(X) \bmod G(X).$$

After appending additional (N−S) zeros and performing additional (N−S) shifts, the remainder in the LFSR can be expressed by the following equation.

$$N'(X) = R(X) * X^{N-S} \bmod G(X) = E(X) * X^{N-S} \bmod G(X)$$

Substituting $E(X) = B(X) * X^S$, we get $$N'(X) = B(X) * X^S * X^{N-S} \bmod G(X)$$
$$= B(X) * X^N \bmod G(X)$$
$$= (B(X) * (X^N - 1) + B(X)) \bmod G(X)$$
$$= B(X) * (X^N - 1) \bmod G(X) + B(X) \bmod G(X)$$

But $X^N - 1 = 0 \bmod G(X)$ for cyclic codes such as the RS code. Substituting, we get $$N'(X) = B(X) \bmod G(X).$$

That is, the remainder of the LFSR after the additional (N−S) shifts is the burst error.

The system 90 for erasure forecasting and error-correction uses a combination of EFFF (EFF_HL and/or EFF_PT), EFFB, and/or BET depending on the nature and causes of errors that need to be corrected. For example, BET is particularly suitable in forecasting and correcting burst errors and is therefore used when errors occur in bursts. The control module 102 configures EFFF, EFFB, and BET using known erasure information. The configuration of the system 90 can be optimized as more erasure information becomes available over time.

Additionally, EFFF_HL and EFFF_PT can be used in any communication system having system-level information that can be used for erasure forecasting purposes and can be applied to an RS decoder. EFFB can be used in any communication system using any interleaver. BET can be used in any communication system that uses a systematic RS code or any cyclic code.

At least one of the control module 102, the EFFF module 104, the de-interleaver module 106, the summing module 108, the RS erasure decoder (RSED) module 110, the EFFB module 112, the BET module 114, and the BET overwrite module 116 may be implemented in a single module.

Figure 8:
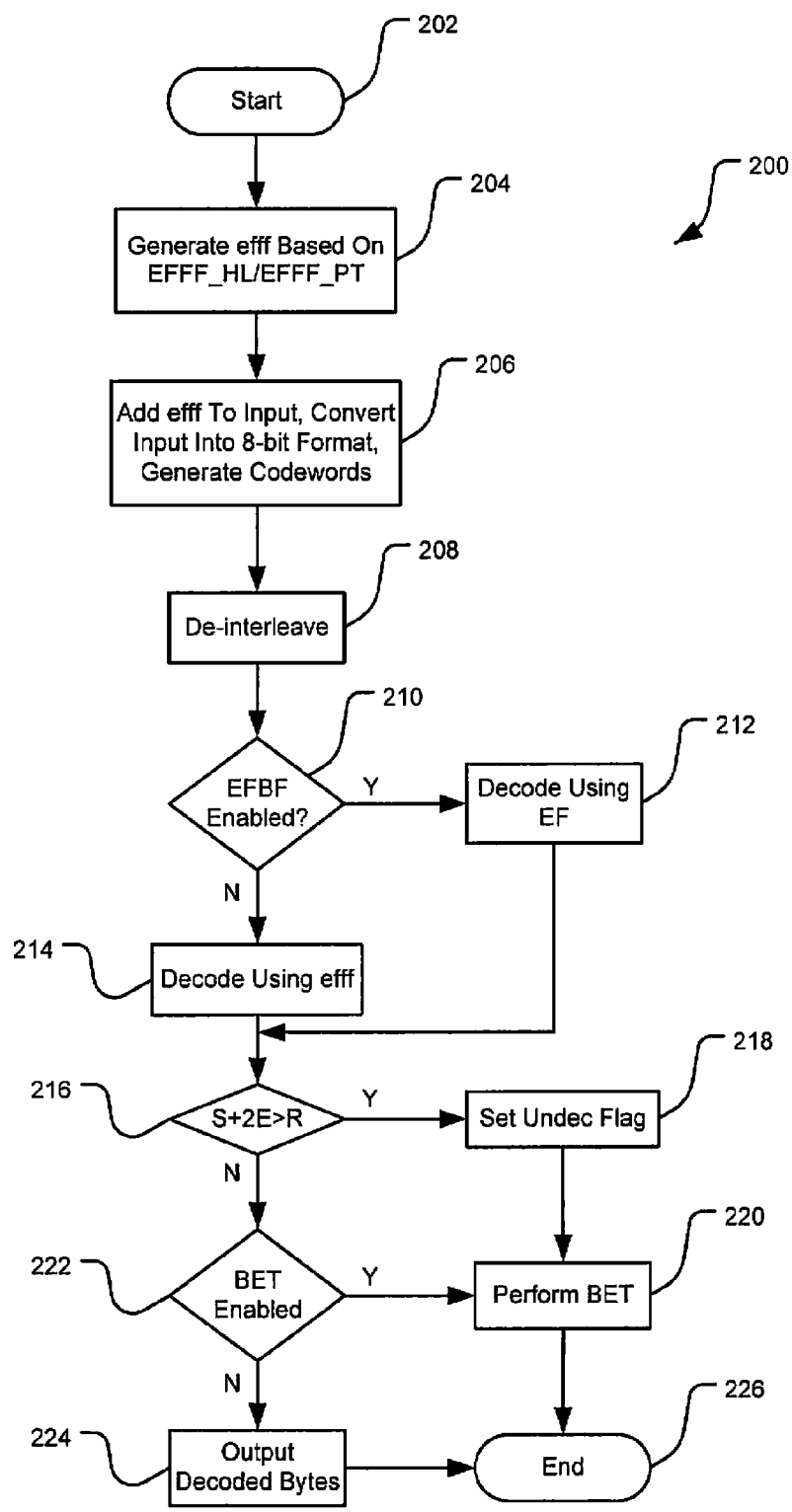
FIG. 8 is a flowchart of an exemplary method for erasure forecasting and error-correction using erasure forecast feed-forward according to the present invention.

Referring now to FIG. 8, a method 200 for erasure forecasting and error-correction that uses an erasure forecast feed-forward scheme begins at step 202. In step 204, the EFFF module 104 generates an efff flag for an input based on whether EFFF_HL and/or EFFF_PT is enabled by the control module 102. The EFFF module 104 attaches the efff flag to the input, converts the input into an 8-bit format, and generates codewords in step 206.

The de-interleaver module 106 de-interleaves or partitions the codewords into multiple regions or segments based on the number of bytes N in the codewords, the interleave factor I, and the interleave depth D in step 208. In step 210, whether the control module 102 enabled EFFB is determined. If enabled, the summing module 108 generates an EF flag by adding an effb flag generated by the EFFB module 112 to the efff flag generated by the EFFF module 104, and the RSED module 110 decodes errors using the EF flag in step 212. Otherwise, the RSED module 110 decodes errors using the efff flag in step 214.

The control module 102 determines whether S+2*E>R in step 216 by examining Chien Search results. If true, an undec flag is set in step 218 indicating RSED failure. The control module 102 activates burst error trapping (BET), and BET is performed in step 220. If false, whether the control module 102 enabled BET to correct any false alarms is determined in step 222. If true, BET is performed in step 220. Otherwise, output of the RSED module 110 is output as the decoded and error-corrected result in step 224, and the method 200 ends in step 226.

Figure 9:
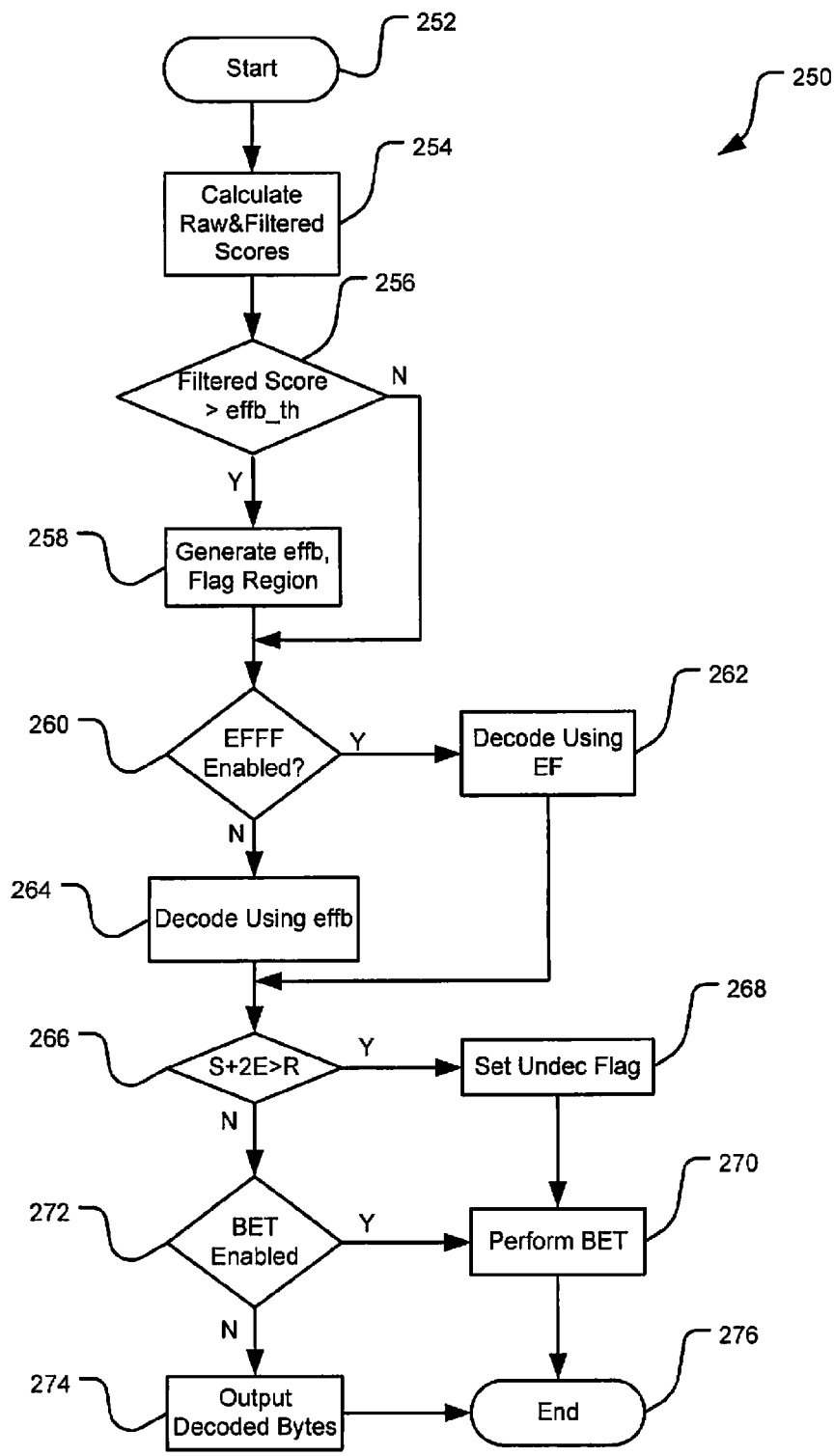
FIG. 9 is a flowchart of an exemplary method for erasure forecasting and error-correction using erasure forecast feedback according to the present invention.

Referring now to FIG. 9, a method 250 for erasure forecasting and error-correction that uses an erasure forecast feed-back scheme begins at step 252. In step 254, the EFFB module 112 calculates raw scores and filtered scores for each region based on a filter level set by the control module 102. In step 256, the EFFB module 112 determines whether a filtered score of each region exceeds a threshold effb_th set by the control module 102. If a filtered score for a region exceeds the threshold effb_th, the EFFB module 112 generates an effb flag and flags the region as erasure in step 258.

In step 260, whether the control module 102 enabled EFFF is determined. If enabled, the summing module 108 generates an EF flag by adding an efff flag generated by the EFFF module 104 to the effb flag generated by the EFFB module 112, and the RSED module 110 decodes errors using the EF flag in step 262. Otherwise, the RSED module 110 decodes errors using the effb flag in step 264.

The control module 102 determines whether S+2*E>R in step 266 by examining Chien Search results. If true, an undec flag is set in step 268 indicating RSED failure. The control module 102 activates burst error trapping (BET), and BET is performed in step 270. If false, whether the control module 102 enabled BET to correct any false alarms is determined in step 272. If true, BET is performed in step 270. Otherwise, output of the RSED module 110 is output as the decoded and error-corrected result in step 274, and the method 250 ends in step 276.

Figure 10:
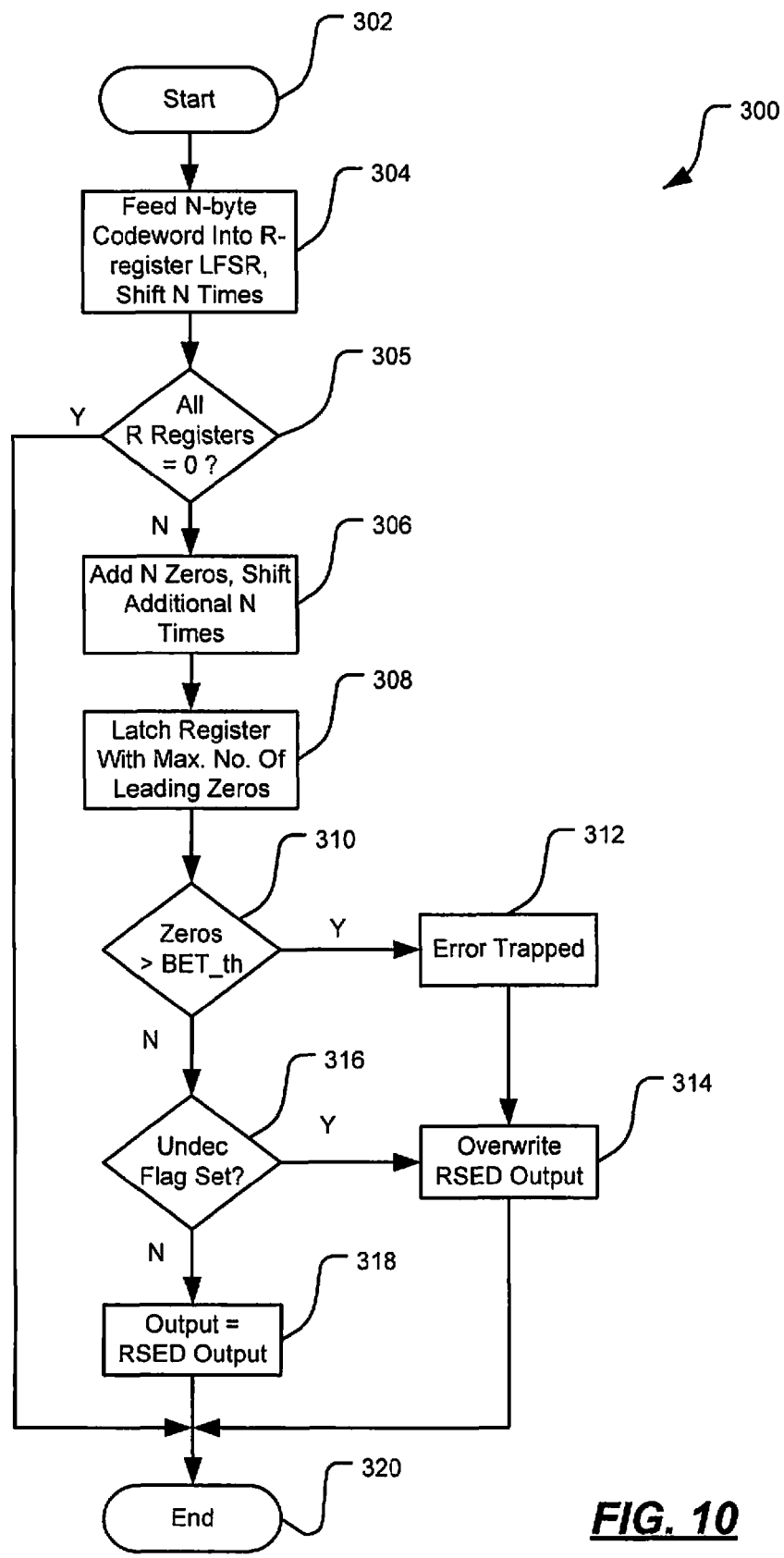
FIG. 10 is a flowchart of an exemplary method for erasure forecasting and error-correction using burst error trapping according to the present invention.

Referring now to FIG. 10, a method 300 for erasure forecasting and error-correction that uses a burst error trapping (BET) scheme begins at step 302. A codeword comprising N bytes of input data and R check-bytes is fed into a linear feedback shift register (LFSR) 132 comprising R registers, and the LFSR 132 is clocked (shifted) N times in step 304. The BET module 114 determines in step 305 whether remainder in all R registers is zero. If true, the codeword is not erroneous, and the method 300 ends in step 320. Otherwise, the codeword is erroneous, and the error needs to be trapped. The LFSR 132 is appended with an additional N zeros and is shifted an additional N times in step 306.

A register with maximum number of leading zeros is latched in step 308. The BET module 114 determines in step 310 whether the maximum number of leading zeros exceeds a threshold BET_th set by the control module 102. If true, a burst error is considered to be trapped in step 312. The BET overwrite module 116 writes the output of BET module 114 over the output of the RSED module 116 in step 314. If false, whether the undec flag is set is determined in step 316. If the undec flag is set, the BET overwrite module 116 writes the output of BET module 114 over the output of the RSED module 116 in step 314. If the undec flag is not set, the output of the RSED module 110 is output as the decoded and error-corrected result in step 318, and the method 300 ends in step 320.

Figure 11B:
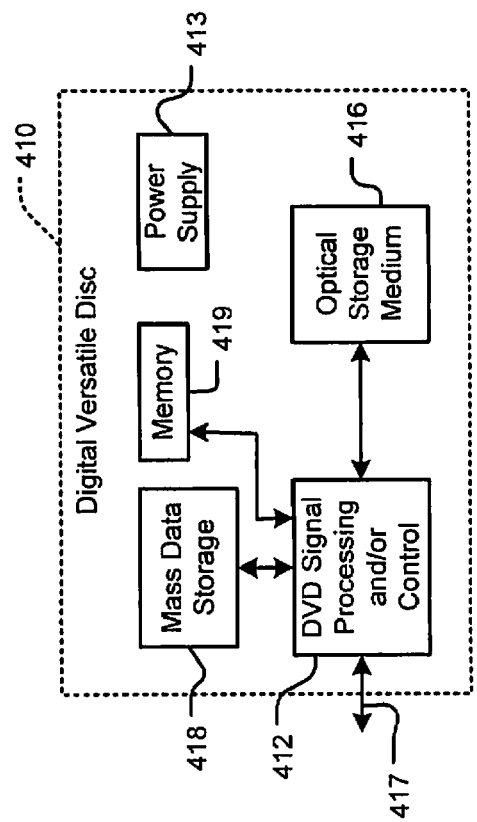
FIG. 11B is a functional block diagram of a digital versatile disk (DVD)
Figure 11A:
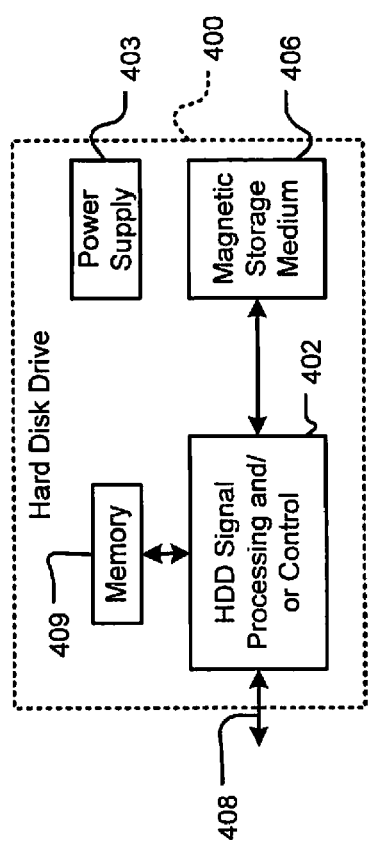
FIG. 11A is a functional block diagram of a hard disk drive.

Referring now to FIGS. 11A-11G, various exemplary implementations of the present invention are shown. Referring now to FIG. 11A, the present invention can be implemented in a hard disk drive 400. The present invention may be implemented in either or both signal processing and/or control circuits, which are generally identified in FIG. 11A at 402. In some implementations, the signal processing and/or control circuit 402 and/or other circuits (not shown) in the HDD 400 may process data, perform coding and/or encryption, perform calculations, and/or format data that is output to and/or received from a magnetic storage medium 406.

The HDD 400 may communicate with a host device (not shown) such as a computer, mobile computing devices such as personal digital assistants, cellular phones, media or MP3 players and the like, and/or other devices via one or more wired or wireless communication links 408. The HDD 400 may be connected to memory 409 such as random access memory (RAM), low latency nonvolatile memory such as flash memory, read only memory (ROM) and/or other suitable electronic data storage.

Referring now to FIG. 11B, the present invention can be implemented in a digital versatile disc (DVD) drive 410. The present invention may be implemented in either or both signal processing and/or control circuits, which are generally identified in FIG. 11B at 412, and mass data storage 418 of the DVD drive 410. The signal processing and/or control circuit 412 and/or other circuits (not shown) in the DVD 410 may process data, perform coding and/or encryption, perform calculations, and/or format data that is read from and/or data written to an optical storage medium 416. In some implementations, the signal processing and/or control circuit 412 and/or other circuits (not shown) in the DVD 410 can also perform other functions such as encoding and/or decoding and/or any other signal processing functions associated with a DVD drive.

The DVD drive 410 may communicate with an output device (not shown) such as a computer, television or other device via one or more wired or wireless communication links 417. The DVD 410 may communicate with mass data storage 418 that stores data in a nonvolatile manner. The mass data storage 418 may include a hard disk drive (HDD). The HDD may have the configuration shown in FIG. 11A. The HDD may be a mini HDD that includes one or more platters having a diameter that is smaller than approximately 1.8". The DVD 410 may be connected to memory 419 such as RAM, ROM, low latency nonvolatile memory such as flash memory and/or other suitable electronic data storage.

Figure 11D:
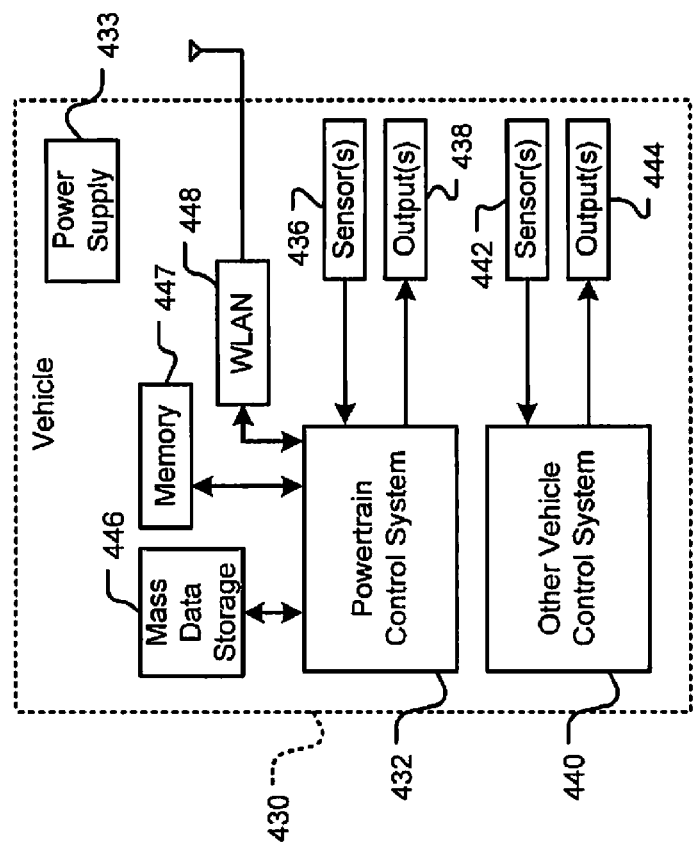
FIG. 11D is a functional block diagram of a vehicle control system.
Figure 11C:
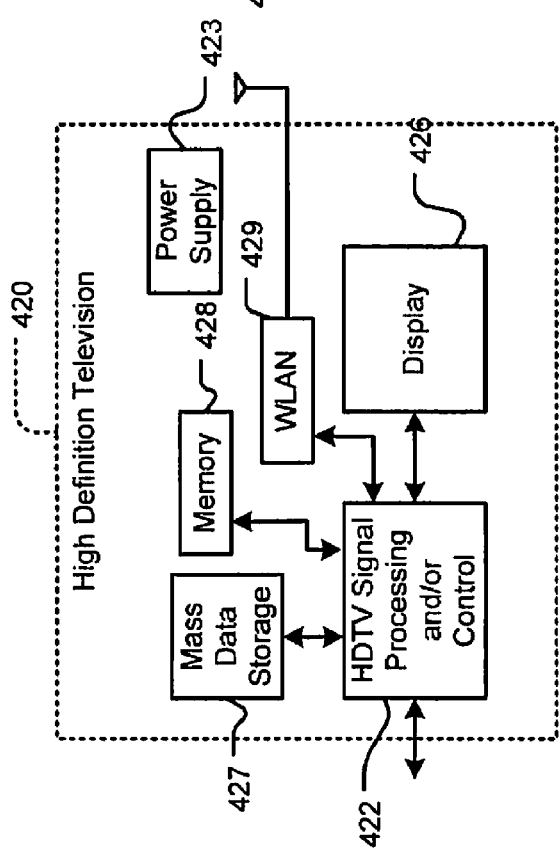
FIG. 11C is a functional block diagram of a high definition television.

Referring now to FIG. 11C, the present invention can be implemented in a high definition television (HDTV) 420. The present invention may be implemented in either or both signal processing and/or control circuits, which are generally identified in FIG. 11C at 422, and mass data storage 427 of the HDTV 420. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. At least one HDD may have the configuration shown in FIG. 11A and/or at least one DVD may have the configuration shown in FIG. 11B. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN network interface 429.

Referring now to FIG. 11D, the present invention may be implemented in a control system of a vehicle 430 and mass data storage 446 of the vehicle control system 430. In some implementations, the present invention may be implemented in a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via a WLAN network interface 448. The control system 440 may also include mass data storage, memory and/or a WLAN interface (all not shown).

Figure 11E:
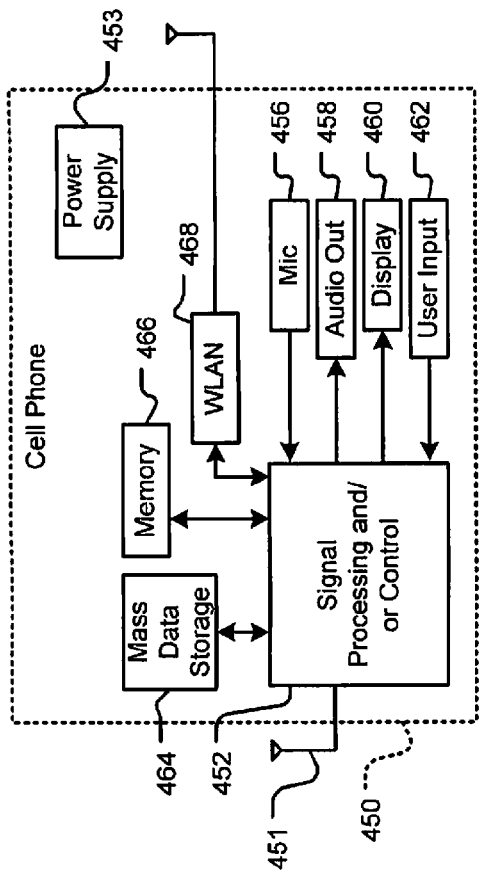
FIG. 11E is a functional block diagram of a cellular phone.

Referring now to FIG. 11E, the present invention can be implemented in a cellular phone 450 that may include a cellular antenna 451. The present invention may be implemented in either or both signal processing and/or control circuits, which are generally identified in FIG. 11E at 452, and mass data storage 464 of the cellular phone 450. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via a WLAN network interface 468.

Figure 11F:
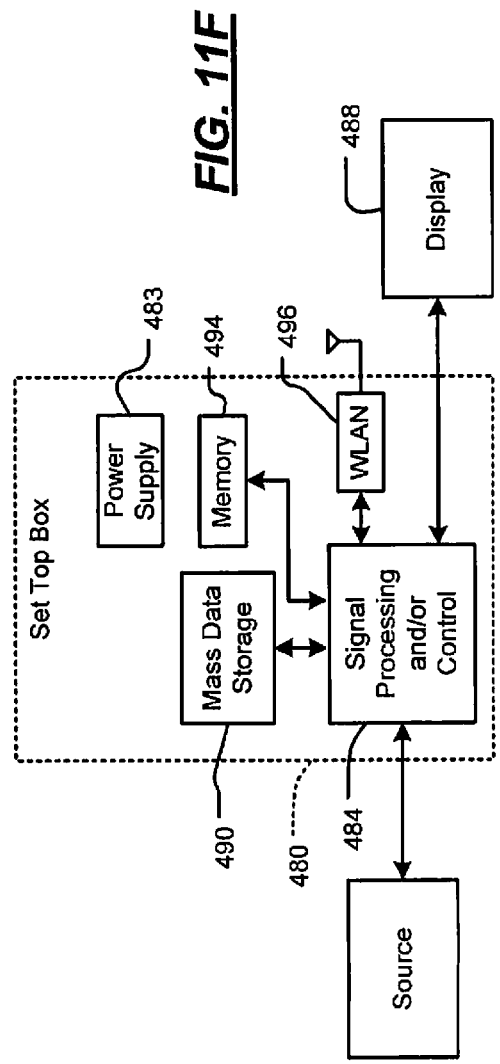
FIG. 11F is a functional block diagram of a set top box.

Referring now to FIG. 11F, the present invention can be implemented in a set top box 480. The present invention may be implemented in either or both signal processing and/or control circuits, which are generally identified in FIG. 11F at 484, and mass data storage 490 of the set top box 480. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via a WLAN network interface 496.

Figure 11G:
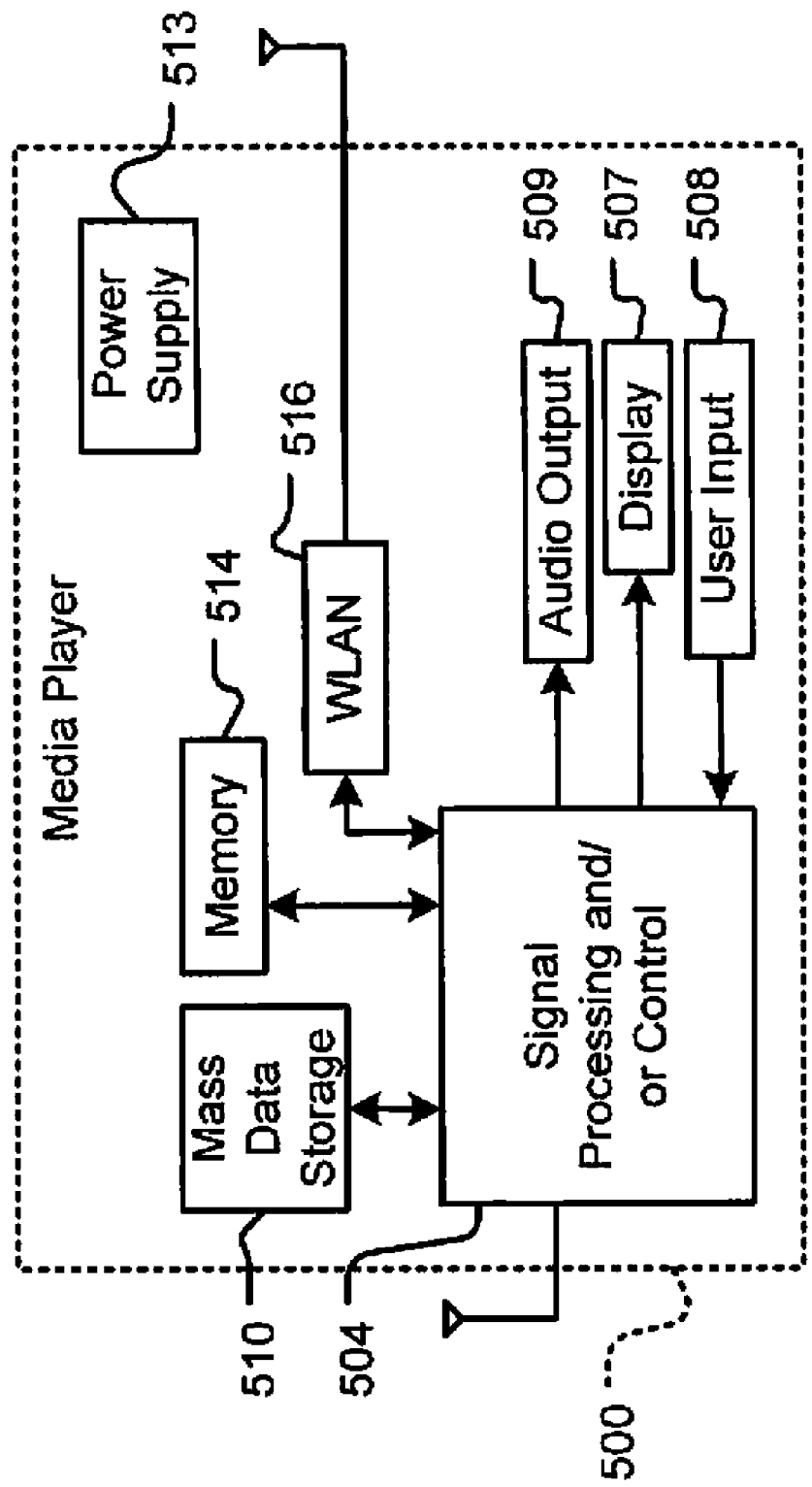
FIG. 11G is a functional block diagram of a media player.

Referring now to FIG. 11G, the present invention can be implemented in a media player 500. The present invention may be implemented in either or both signal processing and/or control circuits, which are generally identified in FIG. 11G at 504, and mass data storage 510 of the media player 500. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 11A and/or at least one DVD may have the configuration shown in FIG. 11B. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN network interface 516. Still other implementations in addition to those described above are contemplated.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A system, comprising:
   a forecasting module configured to forecast a number of erasures in an input signal, wherein the erasures include information about errors in the input signal due to a burst error;
   a decoder module configured to
      decode codewords received in the input signal based on the erasures in response to the number of the erasures being less than or equal to a predetermined threshold, and
      not decode the codewords based on the erasures in response to the number of the erasures being greater than the predetermined threshold; and
   an error detecting module configured to (i) detect the burst error and (ii) decode the codewords in response to the decoder module not decoding the codewords due to the number of the erasures being greater than the predetermined threshold.

2. The system of claim 1, wherein:
   the forecasting module comprises
      a feedback module configured to (i) receive error information from the decoder module, wherein the error information is generated in response to decoding the codewords, and (ii) generate a first signal based on the error information; and
      a feed-forward module configured to (i) receive the input signal and (ii) generate a second signal for the codewords based on predetermined parameters, and
   the decoder module is configured to decode the codewords based on at least one of the first signal and the second signal.

3. The system of claim 2, wherein the feed-forward module comprises a de-mapper module configured to (i) de-map the input signal, (ii) generate a plurality of de-mapped signals, (iii) compare the de-mapped signals to the predetermined parameters, and (iv) generate an error signal.

4. The system of claim 3, wherein the feed-forward module is configured to generate the second signal based on at least one of the error signal and one of the predetermined parameters.

5. The system of claim 3, wherein the forecasting module comprises a formatter module configured to generate the codewords based on the de-mapped signals and the second signal.

6. The system of claim 2, further comprising a de-interleaver module configured to de-interleave the codewords in a plurality of segments based on a length of the codewords, a predetermined interleave factor, and a predetermined interleave depth.

7. The system of claim 6, wherein the feedback module is configured to calculate (i) raw error counts for the segments and (ii) a filtered error-count for each the segments, wherein the filtered error-count is an average of the raw error-counts for a first number of the segments adjacent to each other, and wherein the first number corresponds to a predetermined filter-level.

8. The system of claim 7, wherein the feedback module is configured to (i) determine that one of the segments is erasure and (ii) generate the first signal for the one of the segments if the filtered error-count for the one of the segments is greater than or equal to a predetermined number.

9. The system of claim 6, wherein the decoder module is configured to determine that data in the codewords is erroneous if the data is located in one of the segments determined as erasure by the feedback module.

10. The system of claim 1, further comprising an overwrite module configured to write a first output of the error detecting module over a second output of the decoder module (i) in response to the decoder module not decoding the input signal due to the number of the erasures being greater than the predetermined threshold and (ii) in response to the error detecting module detecting the burst error.

11. The system of claim 1, wherein the error detecting module comprises a linear feedback shift register having a first number of registers, wherein the first number corresponds to an amount of redundancy used in the codewords.

12. The system of claim 11, wherein the error detecting module is configured to:
   load one of the codewords into the linear feedback shift register,
   shift the linear feedback shift register a second number of times, wherein the second number is equal to a length of the codewords, and
   determine that the one of the codewords is not erroneous if the first number of registers have zeros as remainders.

13. The system of claim 11, wherein the error detecting module is configured to:
- load one of the codewords into the linear feedback shift register,
- shift the linear feedback shift register a second number of times, wherein the second number is equal to a length of the codewords,
- append the linear feedback shift register with a third number of zeros, wherein the third number is equal to the second number, and
- perform an additional second number of shifts.

14. The system of claim 13, wherein the error detecting module is configured to determine that the input signal is erroneous if leading zeros in one of the first number of registers having a maximum number of leading zeros after the additional second number of shifts are greater than or equal to a predetermined number.

15. The system of claim 14, wherein the error detecting module is configured to forecast a location of the burst error based on first number, the second number, and a fourth number corresponding to one of the additional second number of shifts generating the maximum number of leading zeros.

16. The system of claim 1, wherein:
- the decoder module is configured to decode the codewords using a cyclic code or a Reed-Solomon code; and
- the error detecting module is configured to detect the burst error using the cyclic code or the Reed-Solomon code.

17. The system of claim 1, wherein the erasures include information about errors in the input signal due to additive white Gaussian noise.

18. A very high bit rate digital subscriber line device comprising the system of claim 1.

19. A method comprising:
- forecasting a number of erasures in an input signal, wherein the input signal includes a number of codewords, and wherein the erasures include information about errors in the input signal due to a burst error;
- in response to the number of the erasures being less than or equal to a predetermined threshold, using the information about the errors contained in the erasures to decode the codewords in the input signal; and
- in response to the number of the erasures being greater than the predetermined threshold,
  - not using the information about the errors contained in the erasures to decode the codewords, and
  - detecting the burst error, and decoding the codewords in the input signal based on having detected the burst error.

20. The method of claim 19, wherein the method is implementable by a computer.

21. A computer program, tangibly stored on a computer readable medium, the computer program comprising instructions for causing a processor to:
- forecast a number of erasures in an input signal, wherein the input signal includes a plurality of codewords, and wherein the erasures include information about errors in the input signal due to a burst error;
- in response to the number of the erasures being less than or equal to a predetermined threshold, use the information about the errors contained in the erasures to decode the codewords in the input signal; and
- in response to the number of the erasures being greater than the predetermined threshold,
  - not use the information about the errors contained in the erasures to decode the codewords, and
  - detect the burst error, and decode the codewords in the input signal based on having detected the burst error.

22. The computer program of claim 21, wherein the computer readable medium comprises a memory or non-volatile data storage.

* * * * *